United States Patent
Kusuda et al.

[11] Patent Number: 5,814,841
[45] Date of Patent: Sep. 29, 1998

[54] SELF-SCANNING LIGHT-EMITTING ARRAY

[75] Inventors: Yukihisa Kusuda, Kukizaki-machi; Kiyoshi Tone, Tsukuba; Ken Yamashita, Tokoyo; Shuhei Tanaka, Tsukuba, all of Japan

[73] Assignee: Nippon Sheet Glass Co., Ltd., Osaka, Japan

[21] Appl. No.: 426,060

[22] Filed: Apr. 21, 1995

Related U.S. Application Data

[63] Continuation-in-part of Ser. No. 324,197, Mar. 16, 1989, abandoned, and Ser. No. 860,203, Mar. 26, 1992, abandoned, and Ser. No. 84,766, Jun. 28, 1993, Pat. No. 5,451,977.

[30] Foreign Application Priority Data

| Mar. 18, 1988 | [JP] | Japan | 63-65392 |
| Jul. 1, 1988 | [JP] | Japan | 63-164353 |
| Sep. 30, 1988 | [JP] | Japan | 63-246629 |
| Sep. 30, 1988 | [JP] | Japan | 63-246630 |
| Oct. 19, 1988 | [JP] | Japan | 63-263402 |

[51] Int. Cl.$^6$ .......................... H01L 29/74; H01L 33/00; H01L 31/111

[52] U.S. Cl. .......................... 257/113; 257/88; 257/146; 372/43; 359/298; 224/238

[58] Field of Search .................................. 257/113, 136, 257/107, 146, 88; 372/43; 359/298; 224/238

[56] References Cited

U.S. PATENT DOCUMENTS

| Re. 31,334 | 8/1983 | Spaulding et al. | 346/1.1 |
| 5,017,991 | 5/1991 | Nishizawa et al. | 257/107 |
| 5,177,405 | 1/1993 | Kusuda et al. | 315/169.1 |

OTHER PUBLICATIONS

Tanij et al., "Light Spot Scanner on a Gallium Arsenide Strip", Solid–State Electronics, 1977, vol. 28, pp. 469–472.

*Primary Examiner*—Mahshid D. Saadat
*Assistant Examiner*—T. M. Arroyo
*Attorney, Agent, or Firm*—Parmelee & Bollinger, LLP

[57] ABSTRACT

A self scanning light-emitting array is disclosed. A coupled array of light-emitting elements is constituted so that a light-emitting element in a minimal conducting state influences the next light-emitting element so that its threshold level is changed. When each element is driven by a common clock pulse, the change in threshold level is shifted in the longitudinal direction, so that a minimal conducting state is transferred in a clock period of the clock pulse.

34 Claims, 27 Drawing Sheets

FIG.8a
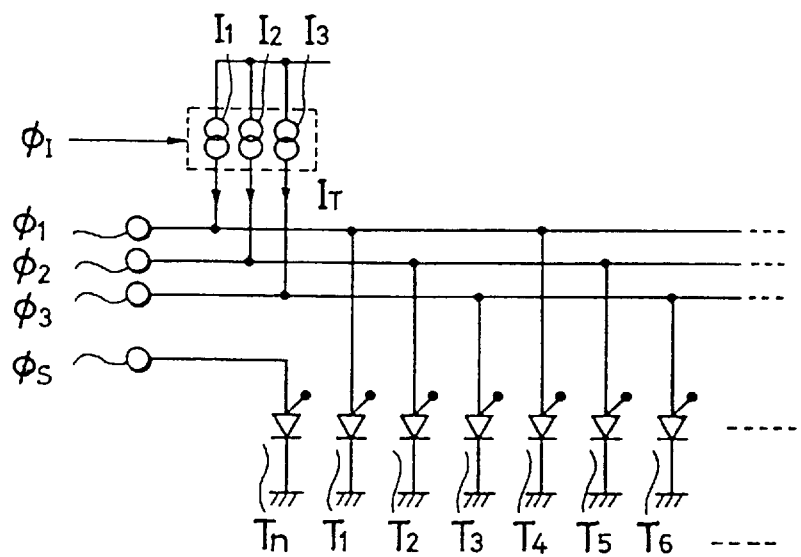
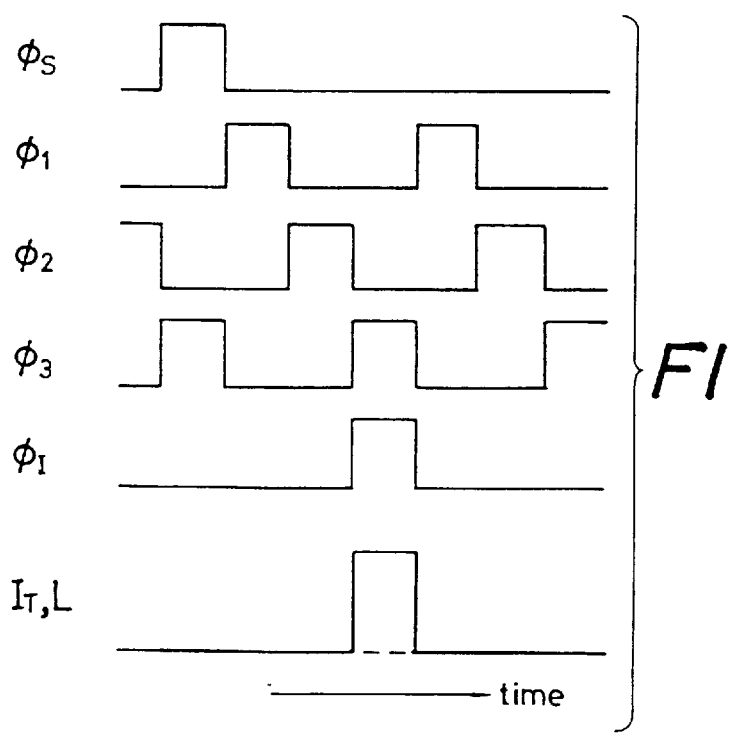
FIG.8b

SELF-SCANNING LIGHT-EMITTING ARRAY

This is a continuation-in-part of application Ser. No. 07/324,197 filed Mar. 16, 1989, now abandoned, of application Ser. No. 07/860,203 filed Mar. 26, 1992, now abandoned, and of Ser. No. 08/084,766 filed Jun. 28, 1993, now U.S. Pat. No. 5,451,977.

BACKGROUND OF THE INVENTION

1. Field of the Invention

The present invention relates to a self-scanning light-emitting array in which light-emitting elements are integrated on a single substrate and a method of driving the same.

2. Description of the Prior Art

Typical light-emitting elements, Light-Emitting Diodes (LEDs) and Laser Diodes (LDs) are known. The LED forms a pn or pin junction made of a compound semiconductor such as GaAs, GaP, GaAlAs or the like. When a forward voltage is applied to the junction to inject carriers in the junction, the LED emits light during carrier recombination. The LD has a waveguide as well as the structure of the LED.

Silicon Controlled Rectifiers (SCRs) are known. The lower gate of the SCR controls its threshold consisting of its gate voltage and its diffusion potential. After the SCR is turned on, the upper gate voltage substantially coincides with the cathode voltage. If the cathode is grounded, the upper gate voltage becomes zero volts with a forward voltage drop on the pn junction.

A waveguide can be formed in the light-emitting thyristor to provide a laser thyristor by quite the same principle as the LD (Tashiro et al., Lecture to the Japan Society of Applied Physics, Autumn 1987, No. 18p-ZG-10).

The LEDs are commercially available in such a manner that a large number of the LEDs are formed on a compound semiconductor substrate or wafer and cut into individual chips or strips including aligned LED cells that are packaged one by one. A plurality of LED chips are soldered on a metal base with a predetermined pitch in alignment with the paper wide direction to provide an LED array for an LED printer.

The LED printer requires an ON/OFF control of the LED chips to render a uni-dimensional image. For example, an A4 size or about 8 inches' wide 300 dpi (dot per inch) LED printer requires about 2,400 LED chips aligned in a line. Also, each of the LED chips must be connected to a buffer IC by wire bonding through its bonding pad to receive the current therefrom and then to perform optical scanning. Therefore, 2,400 buffer ICs are also required as well as 2,400 input signals.

If a large number of individual LED chips are disposed on a predetermined paper width, wire bonding must be performed for portions corresponding in number to the LED chips, and a large number of buffer ICs are required, resulting in a high cost. Also, an assembly such as a wiring bonding process is cumbersome. A space for arranging buffer ICs must be assured, and it is difficult to achieve a compact array. A pitch between adjacent LEDs is determined depending on the size of the bonding pad areas and the wire bonding technique, and it is difficult to decrease the pitch.

To reduce wiring for the 2,400 input signals, a serial to parallel shift register having 2,400 output ports is indispensable. Alternatively, a scanning function of luminous points by these light-emitting thyristors to designate write points would be required.

SUMMARY OF THE INVENTION

It is an object of the present invention to solve the conventional problems by providing a self-scanning function to a light-emitting array itself. When a minimal conducting state among the light-emitting elements itself is scanned by polyphase clock pulses through transfer lines, only a few buffer ICs are required in the transfer lines, and hence, wire bonding pads for light-emitting elements can be almost omitted because the light-emitting elements are connected to the transfer lines in every other or in every third fashion.

It is another object of the present invention to provide a light-emitting array which can stably transfer the minimal conducting state with overlapped polyphase clock pulses.

It is still another object of the present invention to provide a light-emitting array which can facilitate self-scanning control, and can widen a control margin so as not to cause an erroneous operation.

It is still another object of the present invention to facilitate the manufacture of a monolithic self-scanning light-emitting array.

It is still another object of the present invention to provide a self-scanning light-emitting array having light-emitting cells aligned in a longitudinal direction so that a minimal conducting state can be transferred from cell to cell by two or three-phase clock pulses.

It is still another object of the present invention to provide a self-scanning light-emitting array wherein analogous current allows the minimal conducting light-emitting element to display one pixel of the image by ORed current source outputs.

It is yet further object of the invention to provide clock pulses faster than an active pulse width of a current source pulse because the multiplex of an analogous current is more important than transferring a minimal conducting state. If one pixel at nth address should be displayed corresponding to nth light-emitting element where n is a positive integer, n clock pulses are applied to the transfer lines to transfer the minimal conducting state to the nth light-emitting element, and then the additional analogous current from the corresponding current source is supplied thereto. Therefore, the frequency of the clock pulses is predetermined faster than that of the pulse width of the analogous current.

It is still another object of the present invention to provide a self-scanning light-emitting composite array having dot resolution finer than the pitch of light-emitting elements associated with another array of beam deflectors.

It is still another object of the present invention to provide a method of driving a light-emitting array, suitable for stably and reliably performing self-scanning of the light-emitting array.

It is still another object of the present invention to provide a method of driving a light-emitting array, in which a minimal conducting state is transferred in response to clock pulses so that transfer control and sync control of an image display are realized.

According to the present invention, a self-scanning light-emitting array comprises:

an array of light-emitting elements each having a gate and an anode, said elements being made of compound semiconductor;

coupling means for coupling the gate of one of said light-emitting elements to the gate of the next light-emitting element so that a minimal conducting light-emitting element will cause the next light-emitting element to turn on upon applying energy through its anode;

at least two transfer lines each connected to anodes of every at least two light-emitting elements through contact holes;

polyphase clock means ORed to said transfer lines to provide for transferring a minimal conducting state from one light-emitting element to the next; and a controllable current source having outputs each wire ORed to said transfer line to provide the controllable current to said minimal conducting light-emitting elements.

A method of driving a self-scanning light-emitting array of the present invention comprises:

aligning a plurality of light-emitting elements integrated on a common substrate in a line with a predetermined pitch;

coupling each gate of said light-emitting elements to the next gate through a coupling means so that a minimal conducting light-emitting element causes the next light-emitting element to a minimum turn on;

applying polyphase clocks to said light-emitting elements in every at least second fashion so that the minimal conducting state at one of said light-emitting elements is transferred to the next light-emitting element; and supplying an analogous current to said minimal conducting light-emitting element to render a gray scale display, and wherein each of said polyphase clock pulses has an overlapping active period to that of the next clock pulse.

BRIEF DESCRIPTION OF THE DRAWINGS

These and other objects, features and advantages of the invention will become more apparent upon a reading of the following detailed specification in connection with the accompanying drawings, in which:

FIGS. 8a and 8b show a schematic circuit for driving the conventional array of FIG. 1 according to the invention and a timing chart showing pulse waveforms of FIG. 8a, respectively;

DESCRIPTION OF THE PREFERRED EMBODIMENT

Figure 1:
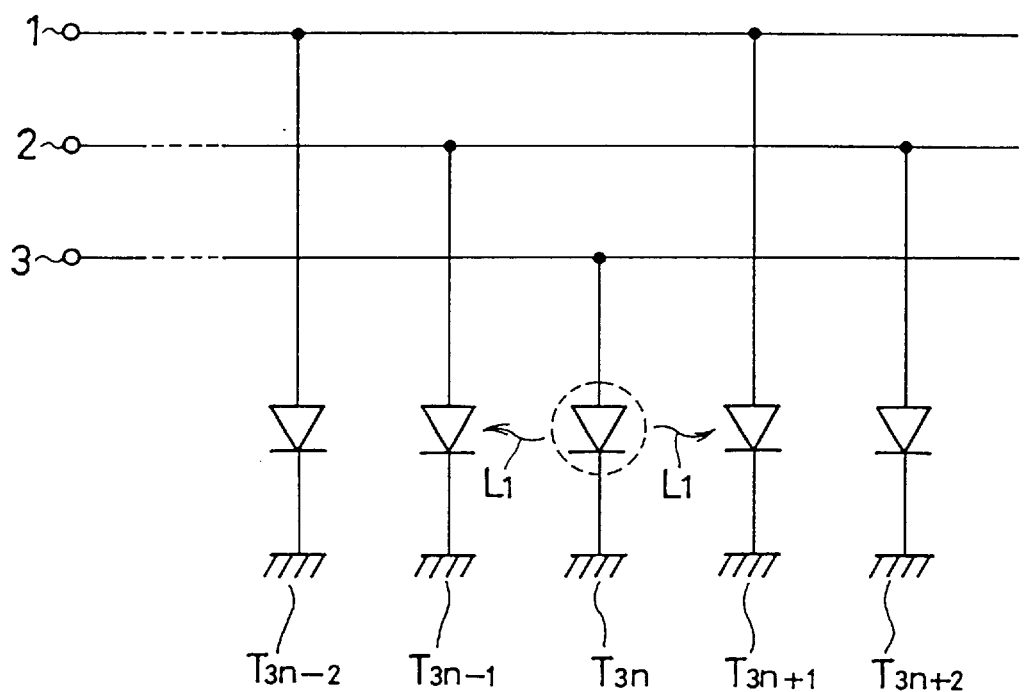
FIG. 1 shows a schematic circuit diagram of a conventional array of light-emitting diodes.

Referring now to FIG. 1, a conventional array of typical Light-Emitting Diodes (LEDs) is shown. The LEDs $T_{3n-1}$ to $T_{3n+1}$ are arrayed where n is a positive integer. Three transfer lines 1 to 3 are connected to anodes of every three LEDs. The LED has characteristics that its turn-on voltage is decreased upon sensing light. Thus, an ON state of the LEDs may be unidirectionally transferred by three-phase clock pulses (see Tani Z. et al., "Light spot scanner on a gallium arsenide strip", Solid-State Electronics, May 1977, UK, Vol. 20, No. 5, pp. 469–472).

The Tani et al. document discloses an array of light-emitting diodes each having a 16 volt turn on voltage or anode voltage without light-coupling to an adjacent LED. This turn on voltage of one LED is decreased to 14 volts when the adjacent LED emits light by sinking 10 milliamperes; 11 volts, 20 milliamperes; 7 volts, 30 milliamperes; and 2 volts, 40 milliamperes. Since the normal operational current of the LED ranges between 1 to 10 milliamperes, its turn on voltage is reduced a small amount to 14 volts. Therefore, disclosed array is not applicable to a 5 volt power supply logic board. To reduce its turn on voltage to an appropriate level, its maximum rating must be reduced by over 40 milliamperes.

According to an array of light-emitting elements of the present invention each having a gate for an electric potential coupling such as a resistor network or a diode coupling, the inventors confirmed experimentally that the turn on voltage of a light-emitting element is reduced to 2 to 4 volts at 10 to 1 milliamperes sink current without considerable gate dissipation when a bias voltage $V_{GK}$ is 5 volt. Then, as the 5 volts' power supply is provided to almost all integrated circuits or logic or memory chips, the present array reliably matches with those chips. Even if light-emitting thyristors are operated with low power dissipation current to provide low power operation, their turn on threshold voltage is substantially constant.

The Tani et al. document discloses a $3\times10^5$ element/second transfer rate or 300 kbps (kilo bit per second) of the light-coupling LEDs. The turn-on transition time $\Delta t_{ON}$ is reported to be 1 to 2 μs upon exposure to a light beam and its turn off time $\Delta t_{OFF}$ is about 0.7 μs.

The turn-on transition time $\Delta t_{ON}$ of the light-emitting element having a gate in the array of the invention is experimentally about 50 ns as well as 50 ns turn-off transition time $\Delta t_{OFF}$ to provide a 10 Mbps transfer rate that is more 30 times faster than those of the LEDs.

The conventional array of light-coupling LEDs is made unstable by external light while the light-emitting element having a gate can be made stable on exposure to external or internal light.

Figure 2:
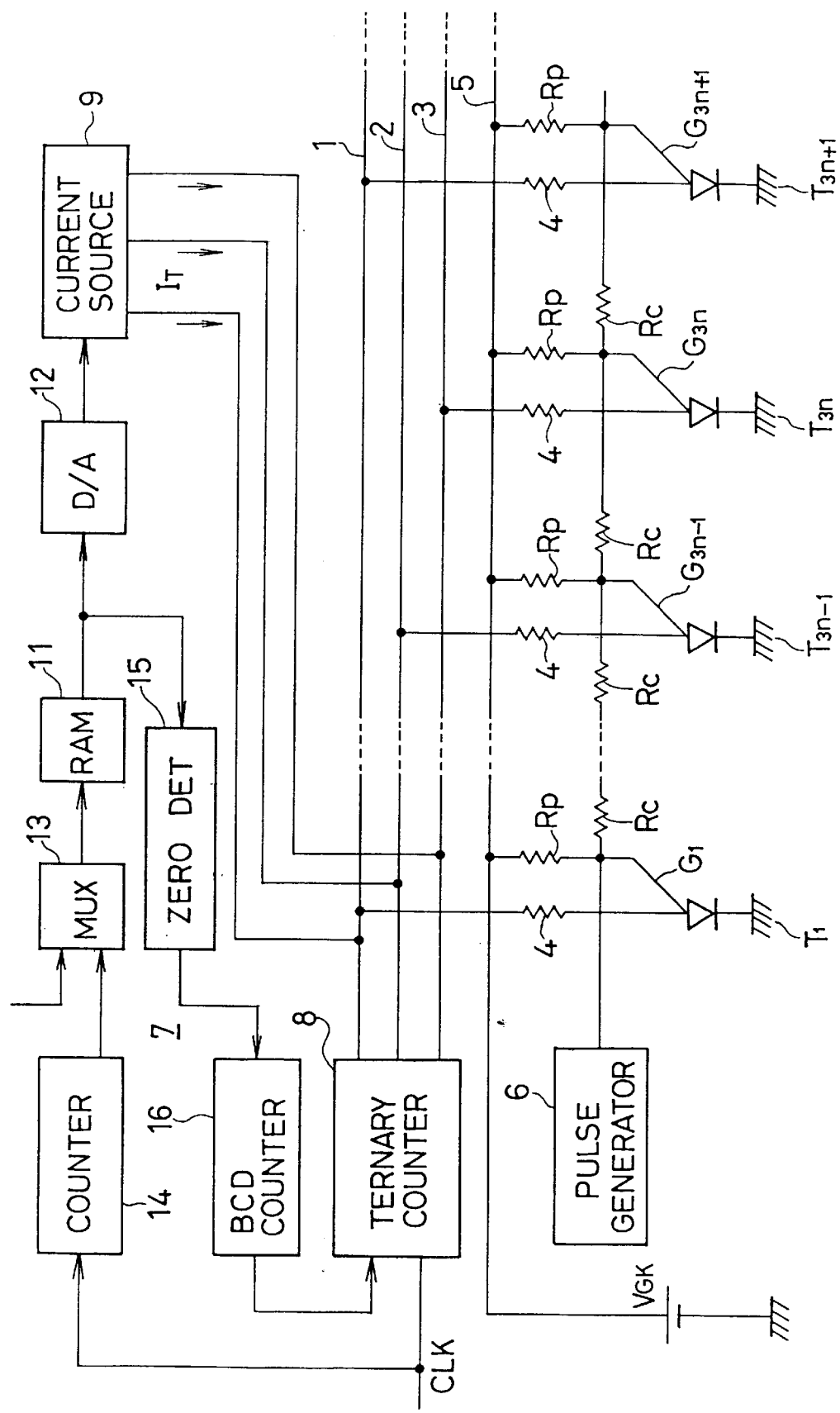
FIG. 2 is a schematic circuit diagram of a light-emitting array of light-emitting elements having a resistor network according to the invention.

Referring now to FIG. 2, there is shown a circuit diagram of an array of light-emitting elements having a resistor network in the form of a resistor sheet according to the present invention.

The light-emitting elements $T_{3n-1}$ to $T_{3n+1}$ having a common cathode or substrate and arranged in, for example, a 600 dpi pitch have upper gates $G_{3n-1}$ to $G_{3n+1}$, respectively, where n is a positive integer. Each of three transfer lines 1 to 3 is sequentially connected to anodes of every three light-emitting elements T through a trimming resistor 4. Each of the trimming resistors 4 are laser trimmed to control or adjust its characteristic deviation of the corresponding light-emitting element. The transfer line 1 is essentially connected to the anodes of the light-emitting elements $T_{3n+1}$. The transfer line 2 is also connected to anodes of the light-emitting elements $T_{3n-1}$. The transfer line 3 is further connected to anodes of the light-emitting elements $T_{3n}$.

With respect to gates of the light-emitting element, for example, one gate $G_{3n-1}$ is electrically connected to the next gate $G_{3n}$ through a coupling resistor Rc to transfer the minimal conducting state therebetween.

A bias voltage $V_{GK}$ is applied to each gate G through a bias line 5 and a corresponding pull-up resistor Rp.

The gate $G_1$ of first light-emitting element $T_1$ is connected to a pulse generator 6 to provide one pulse per a scanning cycle or line for generating a minimal conducting state at anyone of the light-emitting elements at a time.

A clock circuit 7 includes a ternary or modulo-3 counter 8 having three open drain or collector outputs connected or ORed to the three transfer lines 1 to 3 to provide three-phase clock pulses $\phi_1$ to $\phi_3$, respectively, so that at least one of three-phase clock pulses is applied to the minimal conducting light-emitting element to maintain the minimal conducting state. The ternary counter 8 receives, for example, a 10 MHz clock signal to provide 0.1 μs pulse width. Additionally, a current limiting resistor or a diode upon employing a normal buffer may be connected between each output of the clock circuit 7 and the corresponding transfer line 1, 2 or 3.

It is noted that three open drain or collector outputs of a controllable current source 9 are ORed to the transfer lines 1 to 3 in every third fashion, to supply an analogous current $I_T$ to the minimal conducting light-emitting element to provide a gray scale display. Therefore, the current source 9 includes preferably a multi-output current mirror so that the analogous current $I_T$ is controlled proportional to an image signal during a predetermined period.

For example, 8192 light-emitting elements are assumed to be aligned along a longitudinal direction with a 600 dpi pitch. If one pixel at nth address should be displayed corresponding to nth light-emitting element where n is a positive integer, n clock pulses are applied to the transfer lines to transfer the minimal conducting state to the nth light-emitting element, and then the additional analogous current from the corresponding current source 9 is supplied thereto.

If 1 MHz frequency of clock pulses are supplied to the counter 8 to provide a 1 μs pulse width per one pixel and only 8191th pixel is displayed as a worst case, 8192 clock pulses are applied to the transfer lines to complete one scanning line during about 8 ms. If pulses of the analogous current depending upon the image signal are synchronized with the clock pulse, about 8 ms are consumed to complete a 8192 pixel scanning display.

It is noted that the pulse width of the analogous current is predetermined wider than that of the clock pulses. If a 10 MHz frequency of clock pulses are supplied to the counter 8 to provide a 0.1 μs pulse width per one pixel, the pulse width of the analogous current is a 1 μs and only 8191 th pixel is displayed as a worst case, 8190 clock pulses are applied to the transfer lines with 819 μs and then a 1 μs analogous current is applied thereto to reduce the scanning time to 820 μs. Therefore, since about 20% of the 8192 pixel signals have generally non-zero levels, the scanning time of one line is advantageously reduced to about 2.3 ms.

An 8-bit wide 8k RAM buffer 11 may be integrated in the light-emitting array to store the 8k pixel data. The RAM buffer 11 has 8-bit data inputs interfaced or connected to the outer peripheral (not shown) and 8-bit data outputs connected to a flush type digital to analog (D/A) converter 12 whose analog output is in turn connected to an input of the current mirror. The 13-bit address inputs of the RAM buffer 11 are connected through a multiplexer 13 to either the outer peripheral (not shown) or a 13-bit binary counter 14 clocked by the 10 MHz clock pulses.

A zero detector 15 is connected to the data outputs of the RAM buffer 11 to provide a count enable signal for a BCD counter 16 which causes the clock pulse to extend to 10 times. When a zero value on the data inputs of the RAM buffer 11 is detected, the BCD counter 16 is disabled which does not cause the ternary counter 8 to stop. When a gray scale data on the data inputs is detected, the ternary counter 8 is disabled to halt or maintain its count status, the BCD counter 16 is enabled to count 10 pulses and then disabled by its own carry output. During the time the BCD counter 16 is enabled, the D/A converter 12 converts the gray scale data to an analog signal to be supplied to the current mirror that sources the analogous current, for example, 0.04 to 10 mA or 0.12 to 30 mA to the minimal conducting light-emitting element. After receiving the carry output, the ternary counter 8 is activated to start the minimal conducting state transfer operation.

Therefore, the clock circuit 7 or ternary counter 8 provides the current e.g. 1 mA which is enough to maintain a minimal conducting state of any light-emitting element among the many light-emitting elements. The three-phase clock pulses provide a scanning function of the minimal conducting light-emitting element at 10 Mbps rate. The controllable current source 9 or the current mirror provides the analogous current $I_T$, for example, 0.12 to 30 mA corresponding to the gray scale (image) signal $\phi_I$ to the minimal conducting light-emitting element synchronized with the clock pulse during a predetermined period wider than that of the clock pulse to provide a gray scale light intensity.

A scanning operation will be described below. If the clock pulse $\phi_2$ goes HIGH and the light-emitting element $T_{3n-1}$ is minimally turned on, then a potential at the gate $G_{3n-1}$ is reduced to about 0 volt due to its characteristics (about 1 volt for a SCR). As the bias voltage $V_{GK}$ is 5 volts, the gate voltage of the next light-emitting element $T_{3n}$ is determined mainly by the resistance or divider ratio of the next or associated pull-up resistor Rp and coupling resistor Rc, and higher than that of light-emitting element $T_{3n-1}$. The gate voltage of the next light-emitting elements $T_{3n+1}$ is also higher than a light-emitting element $T_{3n}$, by the predetermined amount.

Thus, the further a light-emitting element is disposed from $T_{3n-1}$, the higher its gate voltage or the nearer its gate voltage increases to 5 volts. This can be expressed as follows:

$$V_{G3n-1} < V_{G3n} < V_{G3n+1} \quad (1)$$

A difference between these voltages can be set by appropriately selecting the values of the pull-up resistors Rp and coupling resistors Rc to provide a threshold level for only turning on the next light-emitting element.

As is well known, a turn-on anode voltage $V_{ON}$ of the light-emitting element is higher than a gate voltage $V_G$ by a diffusion voltage $V_{df}$.

$$V_{ON} = V_G + V_{df} \quad (2)$$

Therefore, if the anode voltage is set to be higher than the turn-on voltage $V_{ON}$, the corresponding light-emitting element is minimally turned on to sink, for example, 1 mA enough to transfer the minimal ON state therebetween.

While the former or next light-emitting elements $T_{3n}$ or $T_{3n-2}$ are ready for turning on, a high-level voltage $V_H$ is applied to the next clock pulse $\phi_3$. The clock pulse $\phi_3$ is simultaneously applied to the light-emitting elements $T_{3n}$ and $T_{3n-3}$. If the value of the high-level voltage $V_H$ is set to fall within the following range, only the light-emitting element $T_{3n}$ can be minimally turned on.

$$V_{G3n-3} + V_{df} > V_H > V_{G3n} + V_{df} \quad (3)$$

Thus, both the light-emitting elements $T_{3n-1}$ and $T_{3n}$ maintain minimal conducting states. When the high-level voltage $V_H$ of the clock pulse $\phi_2$ is disabled, the light-emitting element $T_{3n-1}$ is turned off. Thus, the minimal conducting state in one of light-emitting elements can be transferred to the next light-emitting element under the control of the clock pulses.

The high-level period of anyone of the clock pulses $\phi_1$ to $\phi_3$ is also overlapped slightly with that of the next clock pulse, so that the minimal conducting state is reliably transferred among the light-emitting elements.

In this case, three AND-OR gates are added before the ternary counter 8.

The ternary counter 8 having first to third outputs is assumed to be countable by a positive going edge of the 10 MHz clock pulse. The first output of the ternary counter 8 is connected to an input of a two input OR gate whose output corresponds to the clock pulse $\phi_1$. Another input of the OR gate is an output of a three input AND gate whose inputs are 10 MHz clock pulse, and the second output and an inverted version of the third output thereof. The second output of the ternary counter 8 is connected to an input of a two input OR gate whose output corresponds to the clock pulse $\phi_2$. Another input of the OR gate is an output of a three input AND gate whose inputs are 10 MHz clock pulses, and the third output and an inverted version of the first output thereof. The third output of the ternary counter 8 is connected to an input of a two input OR gate whose output corresponds to the clock pulse $\phi_3$. Another input of the OR gate is an output of a three input AND gate whose inputs are 10 MHz clock pulses, and the first output and an inverted version of the second output thereof. More specifically, a luminous point is sequentially transferred therebetween, thereby providing a self-scanning light-emitting array technique superior to any such technique in the prior art.

Figure 3:
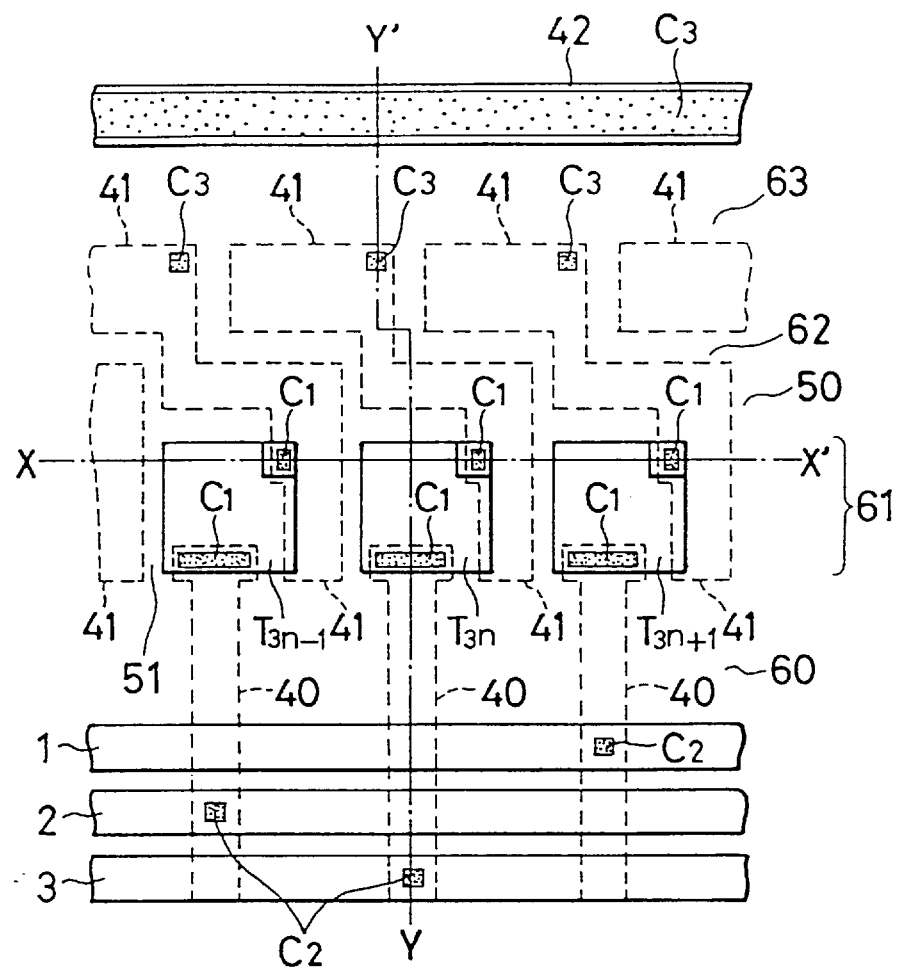
FIG. 3 is a plan view of the array of light-emitting thyristors in FIG. 2.
Figure 4:
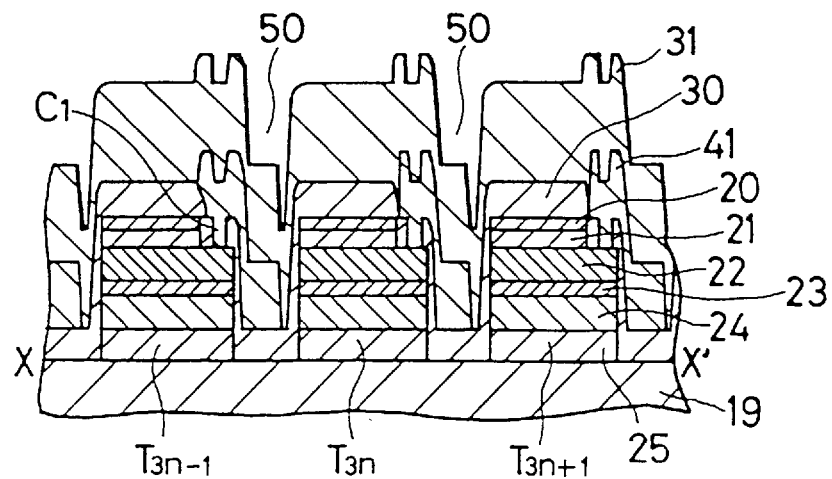
FIGS. 4 and 5 are sectional views of the array taken along lines X–X' and Y–Y' in FIG. 3.
Figure 5:
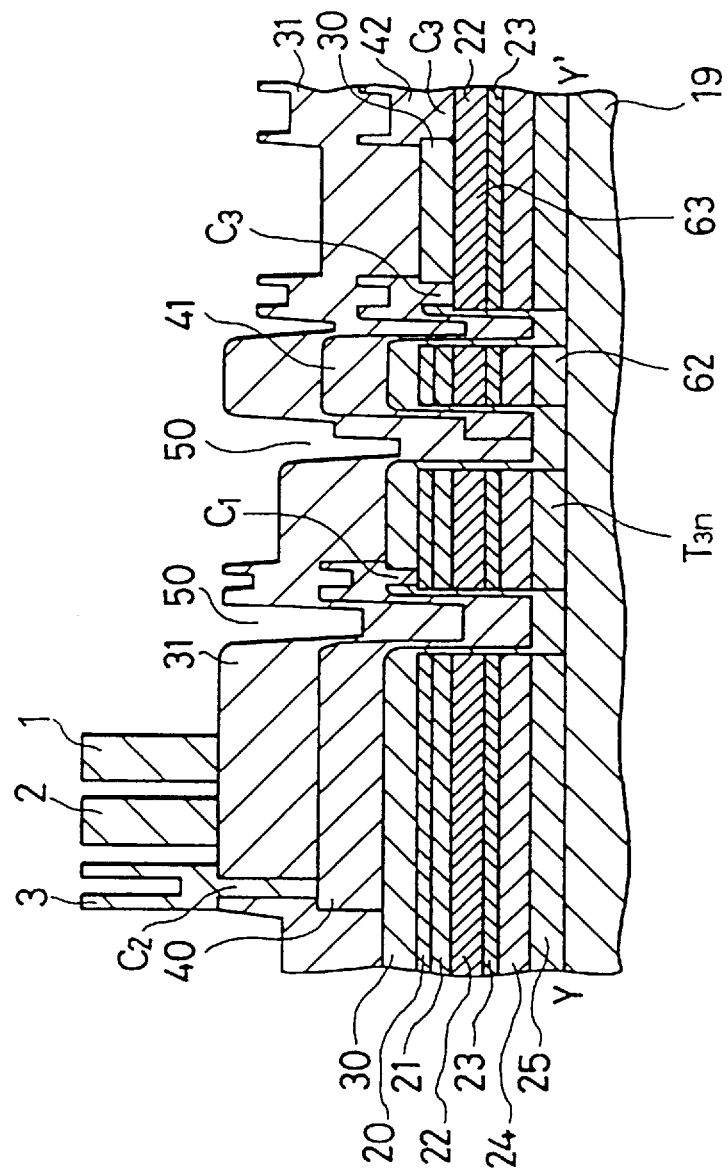

Referring now to FIGS. 3 to 5, an actual structure of FIG. 2 is partially shown. The light-emitting elements or thyristors $T_{3n-1}$ to $T_{3n+1}$ each having an upper gate at the right top portion thereof are arranged in a longitudinal direction.

First, an n-type GaAs layer 25, an n-type AlGaAs layer 24, a p-type GaAs layer 23, an n-type GaAs layer 22, a p-type AlGaAs layer 21, and a p-type GaAs layer 20 are sequentially grown on an n+-type GaAs substrate 19 by an epitaxial growth method to provide a multilayered compound semiconductor structure. Three row grooves or oxidized layers 50 are chemically etched or oxidized to partition a lower transfer line region 60, a middle light-emitting cell region 61, an upper middle light absorption region 62, and an upper resistor network region 63 by photolithography or the like. Each row groove 50 extends along the longitudinal direction and has a bottom of the substrate 19 of the multilayered structure.

In the cell region 61, a plurality of column grooves 51 are provided as well to form cells for light-emitting thyristors $T_{3n-1}$ to $T_{3n+1}$ where n is a positive integer. Light barriers may be partially formed in the column groove 50 around the light-emitting thyristors. The p-type GaAs layer 20 and the p-type AlGaAs layer 21 in the resistor network region and the right top portion of the cells are removed by photoetching using another mask to provide a resistor sheet 63 and gates for light-emitting thyristors, respectively. Thereafter, an insulating layer or film 30 is applied or deposited on an entire upper surface of the structure to prevent short-circuiting between the light-emitting thyristors and the resistor strips 40 and gate metallization 41. The contact holes $C_1$ are provided in the film 30 by photoetching to provide gate portions and anode portions of the light-emitting cells.

In the parent application, a plurality of metallization strips 40 are formed to connect anodes of light-emitting elements to the corresponding transfer lines. After that, three transfer lines 1 to 3 are provided as shown in FIG. 5. In the present application, a plurality of trimming resistors or strips 40 are formed on three transfer lines 1 to 3 via an insulator layer though its vertical structure is not shown so that each of the resistor strips 40 is laser trimmed to adjust its resistance after assembling to compensate for drift or offset characteristics of the light-emitting elements.

Therefore, each of the resistor strips 40 makes an ohmic contact with the corresponding anode portion or p-type GaAs layer 20 through a contact hole $C_3$ passing through two insulating layers 30 and 31. Each gate metallization 41 makes an ohmic contact with the corresponding gate portion or n-type GaAs layer 22 through another contact hole $C_1$ passing through the insulating layer 30. The n-type GaIs substrate 19 serves as a common cathode. For example, the resistor strips 40 and gate metallizations 41 are formed by photoetching, respectively, after a resistor or metal layer is formed by deposition or sputtering, respectively.

The two-dimensional resistor sheet 63 forms the resistor network having a plurality of contact holes $C_1$ each for connecting one gate to the next and to the bias line 5. The light absorbing region 62 is provided to prevent the light beam emitted from the light-emitting thyristors from being inputted to the resistor region 63.

In the transfer line region, a metal layer is then formed by deposition or sputtering to provide transfer lines 1 to 3 by photoetching so that the resistor strips 40 are conventionally electrically connected to the corresponding transfer lines through contact holes $C_2$.

Furthermore, another insulating layer or film 31 is covered or deposited on the entire upper surface of the structure to prevent short-circuiting between the resistor strips 40 and the transfer lines. The insulating film 31 is also photoetched to provide contact holes $C_2$ to expose resistor strips 40 at desired positions.

A portion of the field layer 60 is used as an optical barrier. However, other materials or another shape may be employed.

Thus, anodes of every three light-emitting thyristors $T_{3n-1}$ are connected to the transfer line 2 via the contact holes $C_1$ and $C_2$, and the resistor strip 40 where n is a positive integer. The transfer line 3 is connected to the light-emitting thyristor $T_{3n}$, and the transfer line 1 is connected to the light-emitting thyristor $T_{3n+1}$ as well. The resistor network 63 is connected to each gate of the light-emitting cells or thyristors through a contact hole $C_3$. The other end portion of the resistor sheet 63 is connected to the bias line 5 through another strip or contact slit $C_3$.

These insulating films 30 and 31 must be transparent so that the light beam from the light-emitting element can be efficiently outputted to an external portion. However, to prevent light interference with the nearest elements and the resistance of the resistor sheet 63, the gate metallization 41 can be advantageously extended in the column grooves 51 between the cells and resistor region.

Contact holes $C_1$ of the light-emitting thyristors for the anodes are formed in the insulating films 30 to connect the anodes to the resistor strips 40. Each resistor strip 40 is connected to the transfer lines in every third fashion via a contact hole $C_2$ on the field layer 60. As the resistor sheet 63 for the resistor network, an n-type GaAs layer 22 is used. This layer may be another layer, and another type of film may be formed by, e.g., sputtering without using a semiconductor layer.

A transparent protection film (not shown) may be formed on the transfer lines. If the thickness of the insulating film for degrading the transmittance of light and decreasing the amount of externally outputted light is too large, part of or all the insulating film on the light-emitting thyristor may be removed by, e.g., photoetching.

Another transparent insulating layer 31 is covered with the structure including the resistor strips 40. The resistor strip 40 is connected to a corresponding one of transfer lines 1 to 3 via another contact hole $C_2$. The transfer lines are therefore provided on the another insulating layer 31 and extend along X–X' direction.

The multi-output current mirror must provide sources 0.14 to 30 mA to the minimal conducting light-emitting element. Therefore, three wiring pads for three transfer lines are required in the present light-emitting array to connect externally to three open collectors of the current mirror driver, thereby considerably simplifying its assembly. Because an area for mounting a plurality of drive ICs can be omitted and the size of the contact hole is smaller than that of the bonding pad, a compact self-scanning light-emitting array can be produced. Therefore, an array of light-emitting thyristors each having a smaller pitch can be manufactured according to the invention. Thus, a light-emitting device having a very high resolution can be achieved.

For example, light-emitting thyristors are arranged in an asymmetrical planar pattern, so that a larger amount of light is emitted to the right in the arrangement.

The scope of the present invention includes the adoption of a more complex structure and a multilayered structure to increase light-emitting efficiency. For example, a double-hetero structure may be employed (see, Tashiro et al., Lecture to the Japan Society of Applied Physics, Spring, 1987, No.28-p-ZE-8). In this structure, an n-type GaAs layer 25 having a thickness of 0.5 $\mu$m is formed on an n-type GaAs substrate 19. An n-type AlGaAs layer 24 (1 $\mu$m) having a wide band gap, a p-type GaAs layer 23 (5 nm), an n-type GaAs layer 22 (1 $\mu$m) as a light-emitting layer, a p-type AlGaAs layer 21 (1 $\mu$m) having a wide band gap, and a p-type GaAs layer 20 (0.15 $\mu$m) for making an ohmic contact with a lead electrode are sequentially stacked on the GaAs layer 25. Injected electrons and contact holes are trapped in the GaAs layer 22 having a narrow band gap, and are recombined in this region to emit light.

For example, if a multilayered structure of six layers or more is employed instead of a pnpn four-layered structure, the same effect can be expected, and the same self-scanning function can be achieved. Furthermore, the same effect may be obtained if another type of thyristor, e.g., a static induction (SI) thyristor or a field control thyristor (FCT), is used. The SI thyristor or the FCT has a structure wherein a central p-type semiconductor layer serving as a current block is replaced with a depletion layer.

Figure 6:
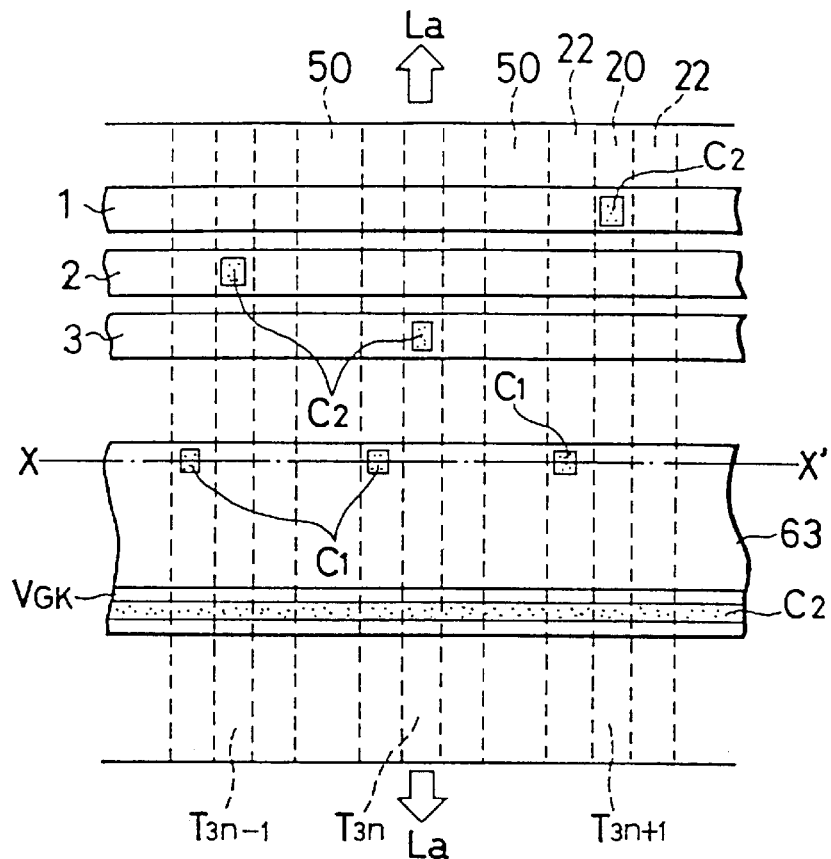
FIGS. 6 and 7 are plan and sectional views of an array of laser thyristors.
Figure 7:
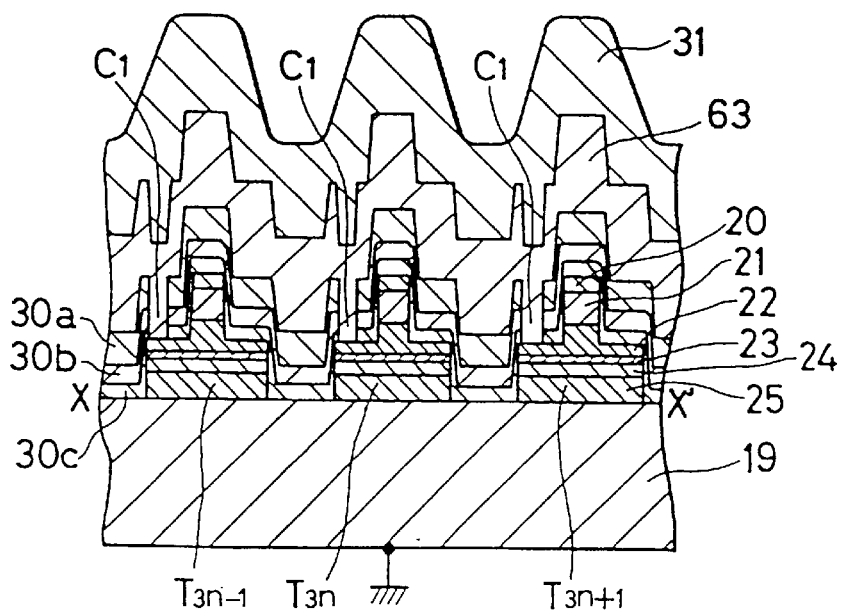

Referring to FIGS. 6 and 7, an array of laser thyristors having a resistor network is shown.

The structure of laser thyristors $T_{3n-1}$ to $T_{3n+1}$ with, for example, a 300 dpi pitch are identical to those of the above light-emitting thyristors except that waveguides are provided along a crosswise direction.

In a manufacturing method, an n-type AlGaAs layer 25, a p-type AlGaAs layer 24, an i-type (non-doped) GaAs layer 23, an n-type AlGaAs layer 22, a p-type AlGaAs layer 21, and an anode layer 20 are sequentially stacked on an n-type GaAs substrate 19 to provide a longitudinal multilayered structure. A p-type GaAs layer for improving an ohmic contact may be sandwiched between the p-type AlGaAs layer 21 and the anode layer 20.

The anode layer 20 is patterned into a plurality of rectangular shapes and column grooves 51 each extending perpendicular to the longitudinal direction. Using the anode rectangular shapes as a mask, the p-type AlGaAs layer 21 to the n-type AlGaAs layer 25 are further etched to form column grooves 51. The stripe shape has a width of 10 $\mu$m or less. Using the new anode pattern 20 as another mask, the p-type AlGaAs layer 21 and the n-type AlGaAs layer 22 are etched. The n-type AlGaAs layer 22 is not entirely removed but is partially left.

Insulating films 30*a*, 30*b* and 30*c* are then formed on the resultant structure. It is noted that the shading film 30*b* is sandwiched between the insulating films 30*a* and 30*c* to provide insulating and shading functions. When a $SiO_2$ film is used as an insulating film, it may allow a light component having a wavelength of 870 nm to pass therethrough to induce a light coupling between light-emitting elements. Thus, the shading film 30*b* formed of a light absorption material, e.g., amorphous silicon, must be sandwiched between the insulating films. Of course, if a material having both insulating and shading functions is used, only one layer needs to be formed.

Contact holes $C_1$ are formed by photoetching, and a resistor sheet 63 is formed thereon and is photoetched. An insulating film 31 is formed on the resultant structure, and contact holes $C_2$ are formed by photoetching. In this case, the contact holes on the resistor sheet 63 can be formed in only the insulating film 31. However, the contact holes on the anode 20 must be carefully formed since the insulating films 31, 30*c*, 30*b* and 30*a* must be simultaneously removed.

A metal layer is then formed by deposition or sputtering to provide transfer lines 1 to 3 and the bias line 5 is formed by photoetching. Finally, the end face of an output side is formed by cleavage or the like to provide good parallelness.

It is noted that the respective transfer line includes a plurality of trimming branches each connected to the anode thereof through the contact hole. Each trimming branch is laser trimmed after assembling the array.

The light-emitting arrays have a self-scanning function and can provide effects of efficient assembly, compactness, a decrease in pitch, and the like.

For example, a more complex structure and an arbitrary structure constituted by six or more layers may be adopted.

In the present invention, other materials may be used for the substrate. For example, an n-type GaAs layer corresponding to the n-type GaAs substrate 19 is formed on a Cr-doped semi-insulating GaAs substrate. Alternatively, a semiconductor film is formed on an insulating substrate of, e.g., glass, alumina, or the like, and the structure may be formed using this semiconductor.

For example, a TJS type, a BH type, a CSP type, a VSIS type, and the like may be employed (S.M. Sze, supra, pp. 724–730). AlGaAs material has been mainly described. However, other materials (e.g., AlGaInP, InGaAsP, ZnSe, GaP, and the like) may be used.

It is noted that each of laser thyristors laterally emits a light beam or laser perpendicular to the longitudinal direction of the array. Alternatively, each of the laser thyristors vertically emits a light beam or laser perpendicular to the longitudinal direction. In which case, a mirror substrate layer and a mirror anode layer are provided to sandwich the laser thyristors each having a gate so that a conductive mirror layer is applied on or below the compound semiconductor substrate and conductive mirror anode layers are applied on the anodes of the light-emitting elements.

An array of microlaser diodes is available from Photonics Research Incorporated in Boulder, Colo. Similarly, it is known to provide an LED having mirrors to emit a laser beam normal to an anode surface.

FIG. 8a shows a driver circuit according to the present invention for a conventional array of LEDs having a drive principle with pulse waveforms applied to wire bonding pads. Current outputs $I_1$ to $I_3$ are ORed to transfer lines 1 to 3, respectively, as well as three outputs of a clock circuit 7. Then, its analogous current $I_T$ controlled by a gray scale signal $\phi_1$ is supplied to the minimal conducting LED.

In operation, an LED $T_0$ is minimally turned on in response to a start impulse $\phi_s$. As the clock pulses $\phi_1$ to $\phi_3$ are sequentially applied to the transfer lines 1 to 3 in every third fashion, a minimal conducting state is transferred from the LED Tn where n is a positive integer.

If the LED $T_3$ is minimally turned on to emit light sufficient to cause the adjacent LEDs to minimally turn on and the gray scale signal $\phi_I$ goes synchronously HIGH, $I_3$ of the current source 9 provides an analogous current to the anode of the minimal conducting LED $T_3$. Even if the remaining current outputs $I_1$ and $I_2$ have capability of additional source currents, other LEDs in OFF states cannot sink such currents. Therefore, the anode current of the minimal conducting LED is increased by the current source to increase its luminous intensity.

FIG. 8b also illustrates a waveform of the luminous intensity L. The luminous intensity of the LED $T_3$ is increased as compared to those of other LEDs when no analogous currents are provided thereto. When this drive method is used, the luminous intensity at an arbitrary position of LEDs can be increased to provide a locational optical write operation to a photosensitive medium.

If the anode current of the minimal conducting laser thyristor is increased by the current source to a threshold of laser oscillation, a laser beam can be emitted along its waveguide upon applying a gray scale signal and no laser beam is emitted in the normal direction.

Figure 9:
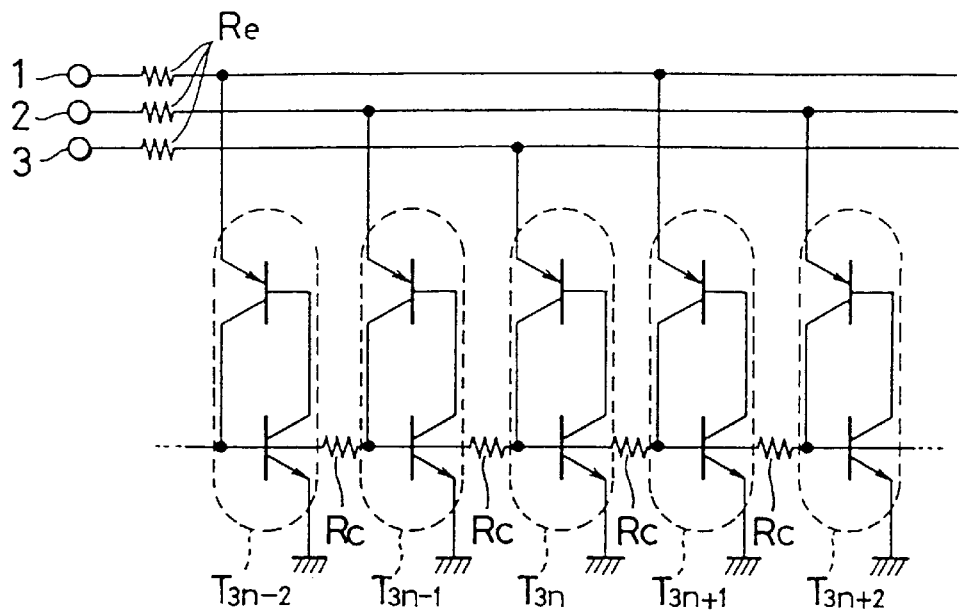
FIG. 9 is a circuit diagram of an array of light-emitting elements having interconnected lower gates.

Referring now to FIG. 9, there is shown a circuit diagram of an array of light-emitting elements each having a lower gate connected to the next through an integral resistor.

The light-emitting elements $T_{3n-1}$ to $T_{3n+1}$ whose threshold can be externally controlled are aligned in a line with a 600 dpi pitch where n is a positive integer. Each coupling resistor Rc is connected between lower gates of adjacent light-emitting elements. Each of three transfer lines 1 to 3 is sequentially repetitively connected to the anodes of every third light-emitting element. A clock circuit 7 has three open drain or collector outputs ORed to the three transfer lines 1 to 3 through current-regulating resistors Re to provide three-phase clock pulses $\phi_1$ to $\phi_3$, respectively, so that at least one of three-phase clock pulses is applied to the minimal conducting light-emitting element to maintain the minimal conducting transfers. It is noted that three open drain or collector outputs of a controllable current source 9 are ORed to the transfer lines 1 to 3 in every third fashion, to supply an analogous current $I_T$ to the conducting light-emitting element to provide a gray scale display or multiple unit current thereto.

When a clock pulse $\phi_3$ goes HIGH and a light-emitting element $T_{3n}$ is turned on, its lower gate voltage is increased enough to cause the adjacent light-emitting elements $T_{3n-1}$ and $T_{3n+1}$ to minimally turn on through the coupling resistors Rc. As long as the transfer lines 2 and 1 remain LOW, the light-emitting elements $T_{3n-1}$ and $T_{3n+1}$ stay off. The resistances of the coupling resistors Rc are adjusted so that upon applying the next clock pulse $\phi_1$, the next light-emitting element $T_{3n+1}$ is minimally turned on but the preceding light-emitting element T3n−3 is not turned on.

Figure 10:
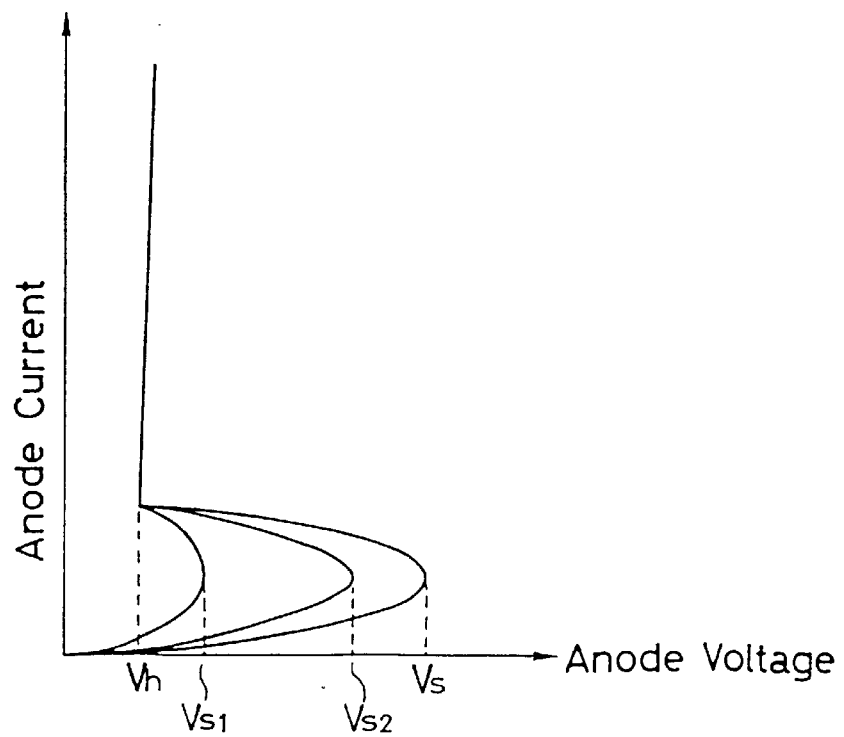
FIG. 10 is a graph showing characteristics of the light-emitting element.

When the lower gate current of the light-emitting element is increased, its threshold voltage is decreased to a hold voltage Vh for maintaining its minimum conducting state. In FIG. 10, the anode voltage of the light-emitting element is plotted along the abscissa, and the anode current is plotted along the ordinate. The threshold voltage Vs of any light-emitting element is assumed to be free from any external influences. The threshold voltages $V_{S3n-1}$ and $V_{S3n+1}$ of the light-emitting elements $T_{3n-1}$ and $T_{3n+1}$ adjacent to the minimal conducting light-emitting element $T_{3n}$ are decreased to $V_{s1}$ for the above-mentioned reason. The threshold voltages of the next closest light-emitting elements T3n−2 and T3n+2 become the threshold voltage $V_{S2}$ since the influence of the gate current is reduced by two serial coupling resistors Rc.

In FIG. 9, a clock pulse $\phi_1$ next to the clock pulse $\phi_3$ is applied to the light-emitting elements $T_{3n+1}$ and T3n−2. Since their threshold voltages respectively become threshold voltages $V_{s1}$ and $V_{S2}$ for the above-mentioned reason, if the high-level voltage of the clock pulse is predetermined to occur between the threshold voltages $V_{s1}$ and $V_{s2}$, only the light-emitting element $T_{3n+1}$ can be minimally turned on.

Figure 11:
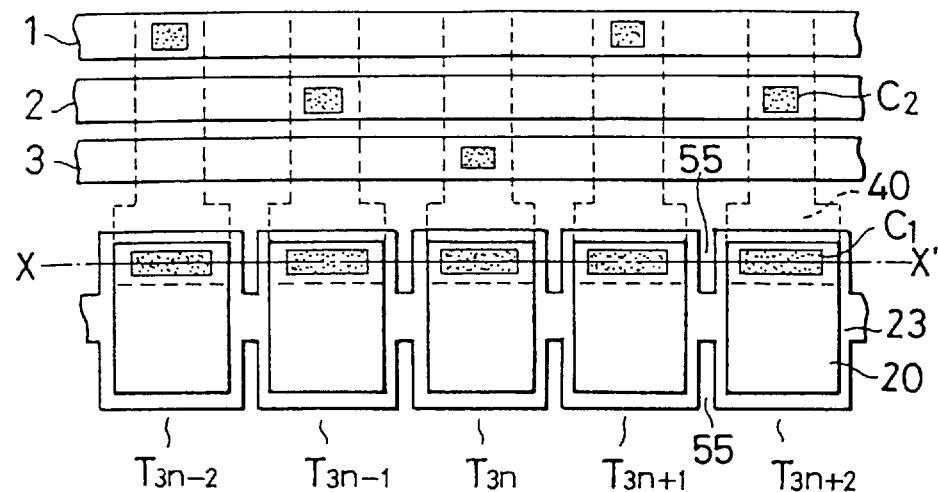
FIGS. 11 and 12 show plan view and sectional views of the array of light-emitting thyristors shown in FIG. 9.

As will be seen in FIG. 11, the transfer lines 1 to 3 are connected to trimming resistor strips 40 via contact holes $C_2$. Each resistor strip 40 is connected to a p-type GaAs layer 20 of each light-emitting thyristor via contact holes $C_1$. A p-type GaAs layer 23 for gates of the light-emitting thyristors is illustrated around the rectangular p-type GaAs layers 20. Notches 55 are formed in the layer 23 to optimize or adjust the resistances of coupling resistors Rc.

Figure 12:
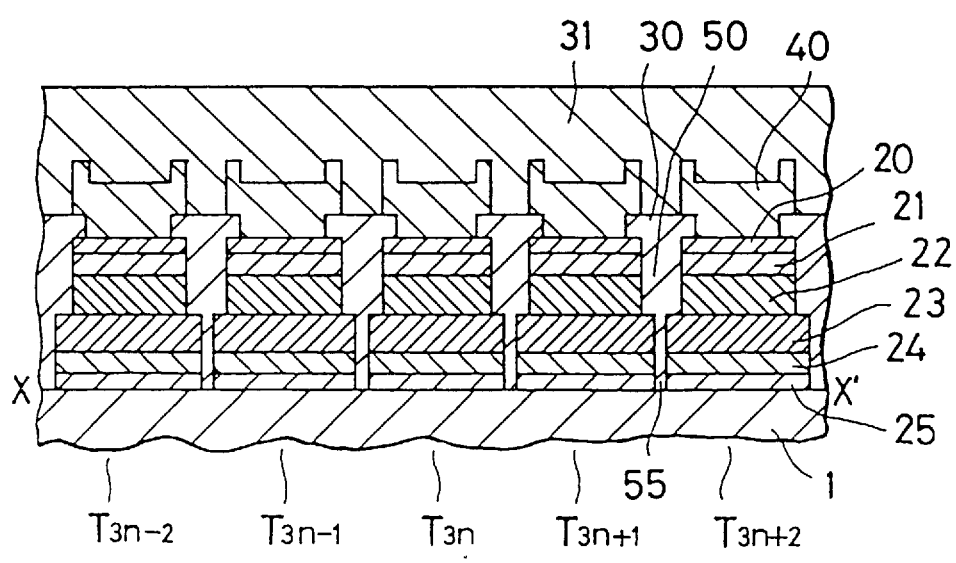

Referring now to FIG. 12, an n-type GaAs layer 25, an n-type AlGaAs layer 24, a p-type GaAs layer 23, an n-type GaAs layer 22, a p-type AlGaAs layer 21, and a p-type GaAs layer 20 are sequentially formed on an n-type GaAs substrate 19. Column grooves 51 for isolating the resultant structure into individual light-emitting thyristors are formed by photolithography or the like and etching. Notches 55 are trimmed for changing the value of the coupling resistors Rc that are provided on the p-type GaAs layer 23. An insulating layer 30 performs isolation between the resistor strips 40 and the laser thyristors. The insulating layer 30 preferably uses an opaque material to provide optical isolation among the light-emitting thyristors or may comprise a multilayered structure having an insulating function and an optical isolation function. When the optical isolation function is provided, an additional window must be formed so that light can be externally outputted. The transfer lines 1 to 3 are formed on the insulating film 30. Another insulating film 31 is formed on the transfer lines and then contact holes $C_1$ and $C_2$ are formed therein to expose the anodes thereof and the transfer lines, respectively. Thereafter, the resistor strips 40 are formed on insulating film 31 to include the contact holes.

As described above, no lower gate pad is required, coupling resistors Rc for connecting the adjacent light-emitting thyristors can be formed on or can be integral with the compound semiconductor layer. The light-emitting array structure can be formed by a simple manufacturing process. It is noted that a resistor for performing an electrical connection is formed by using a portion of a light-emitting thyristor, so that a resistor thyristor can also be formed by the same process as in the light-emitting thyristor.

For example, the formation order of the column grooves 51 and the notches 55 may be reversed. A transparent insulating film may be formed on the structure shown in FIG. 12 to improve reliability. If the thickness of the insulating film for degrading the transmittance of light and decreasing the amount of externally outputted light is too large, part or all the upper insulating film of the light-emitting thyristor may be removed by, e.g., photoetching. GaAs and AlGaAs layers are used as semiconductor layers. The light-emitting array can be operated by four or more phase clock pulses.

Figure 13:
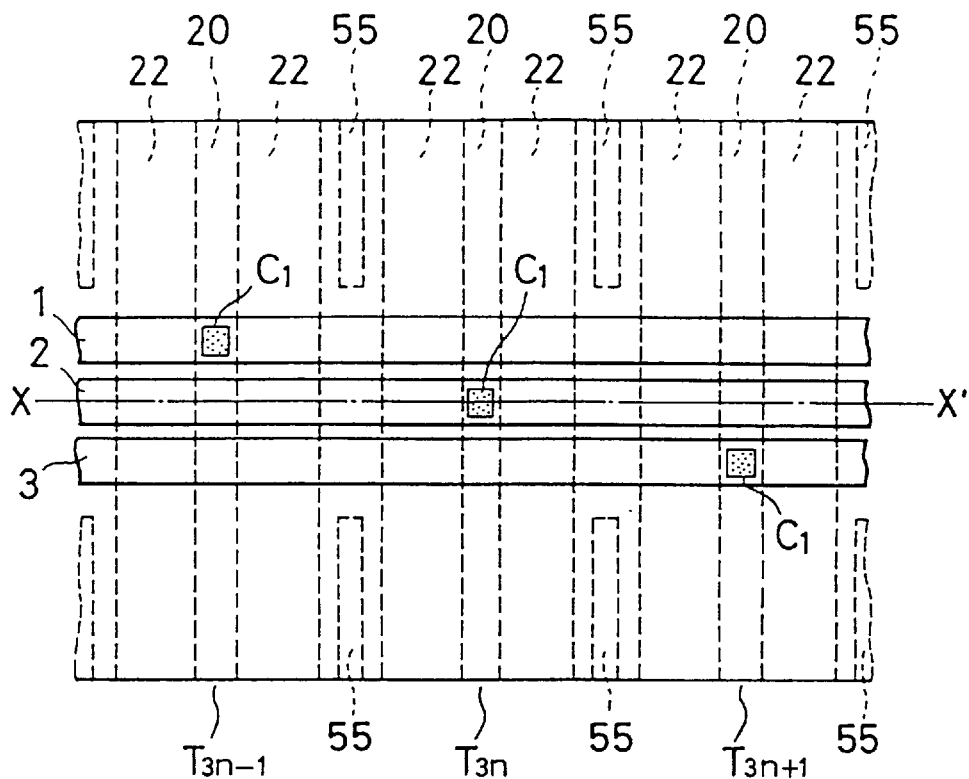
FIGS. 13 and 14 show plan and sectional views of the array of laser thyristors in FIG. 9.
Figure 14:
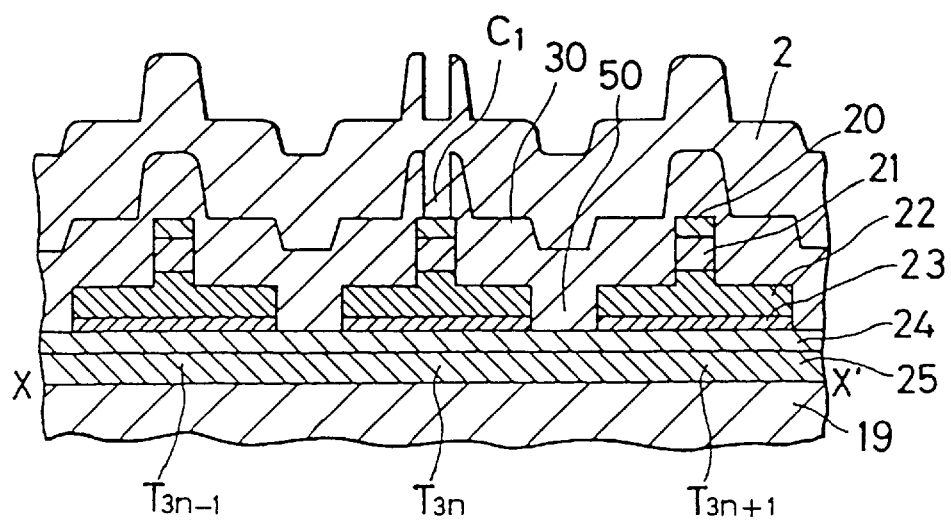

FIGS. 13 and 14 are plan and sectional views of an array of laser thyristors having lower gates integral with coupling resistors.

A manufacturing method for the aforesaid structure will be briefly described below. An n-type AlGaAs layer 25, a p-type AlGaAs layer 24, an i-type (non-doped) GaAs layer 23, an n-type AlGaAs layer 22, a p-type AlGaAs layer 21, and an anode layer 20 are sequentially stacked on an n-type GaAs substrate 19.

The anode layer 20 is patterned into a plurality of rectangular shapes and column grooves 51 each extending perpendicular to the longitudinal direction. Using the anode rectangular shapes as a mask, the p-type AlGaAs layer 21 to the i-type GaAs layer 23 are further etched to form column grooves 51. Each of the anode shapes is further etched into a stripe pattern (current injection portion of a laser thyristor) having a width of 10 $\mu$m or less. Using the new anode pattern 20 as another mask, the p-type AlGaAs layer 21 and the n-type AlGaAs layer 22 are etched. The n-type AlGaAs layer 22 is not entirely removed but is partially left. Notches 55 are formed by photoetching. Thereafter, an insulating film 30 is formed.

The insulating film preferably has two functions, i.e., insulating and shading functions, and may be formed by a plurality of types of films. When an $SiO_2$ is used as the insulating film, it may allow light having a light-emitting wavelength of 870 nm of GaAs to pass therethrough to induce the light coupling. Thus, a shading film of a light absorption material such as amorphous silicon must be sandwiched between the $SiO_2$ films.

Contact holes $C_1$ are formed by photoetching. A metal layer is formed by deposition or sputtering to provide the transfer lines 1 to 3 by photoetching. Finally, the end face of a laser beam output side is formed by cleavage or the like to have good parallelness.

Figure 15:
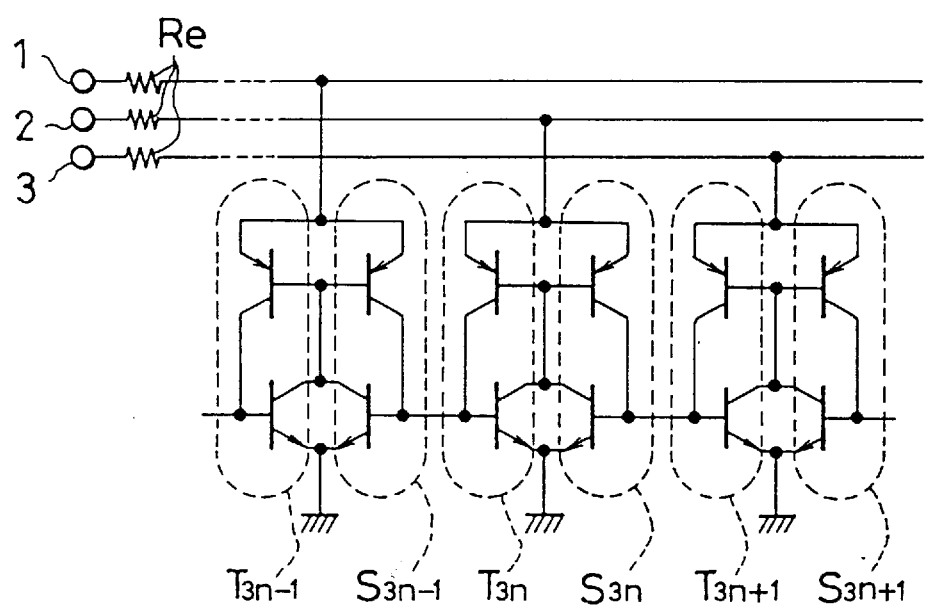
FIG. 15 is a circuit diagram of an array of cells each having main and subsidiary light-emitting elements.
Figure 16:
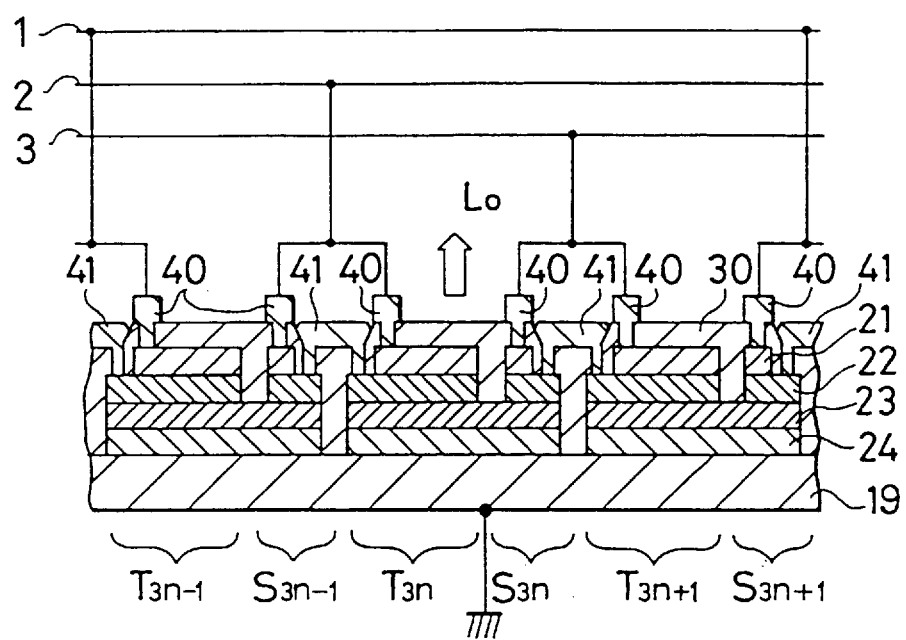
FIG. 16 is a sectional view of FIG. 15.

FIGS. 15 and 16 show a plurality of light-emitting cells each having main and subsidiary light-emitting elements T and S. The main and subsidiary light-emitting elements T and S in the cell have a common lower gate.

The main and subsidiary light-emitting elements $T_{3n-1}$ and $S_{3n-1}$, $T_{3n}$ and $S_{3n}$, and $T_{3n+}$ and $S_{3n+1}$ are arranged or disposed on a common substrate or ground in a line, for example, a 600 dpi pitch where n is a positive integer. In FIG. 15, the subsidiary light-emitting element $S_{3n-2}$ is shown instead of $S_{3n+1}$. Anodes of the subsidiary and main light-emitting elements $S_{3n-2}$ and $T_{3n-1}$ the transfer line 1; anodes of $S_{3n-1}$ and $T_{3n}$ are connected to the transfer line 2; and anodes of $S_{3n}$, and $T_{3n+1}$ are connected to the transfer line 3. The main light-emitting elements $T_{3n-1}$, $T_{3n}$ and $T_{3n+1}$ have upper gates connected to those of the subsidiary light-emitting elements $S_{3n+1}$, $S_{3n-1}$ and $S_{3n}$ respectively. Each transfer line has a current-limiting resistor Re.

If the clock pulse $\phi_2$ goes HIGH, the light-emitting elements $S_{3n-1}$ and $T_{3n}$ are turned on. The common lower gate potential of the light-emitting elements $T_{3n-1}$, $S_{3n-1}$, $T_{3n}$ and $S_{3n}$ go high potential (about 1 volt) thereby providing the capability of current flow. Therefore, a light-emitting element $S_{3n}$ will be turned on upon applying the voltage or current from the clock pulse.

In this state, when the next clock pulse $\phi_3$ goes an appropriate high-level voltage, the main light-emitting element $T_{3n+1}$ is immediately turned on because its upper gate current is sunk by the minimal conducting state subsidiary light-emitting element $S_{3n}$. Thus, a current flows through the main light-emitting element $T_{3n+1}$. For this reason, the next light-emitting element $S_{3n+1}$ is also successively turned on upon supplying the current to its anode. On the other hand, other cells receiving the clock pulse $\phi_1$ are not influenced by the cell 3n+1, and hence are not turned on. A wide range of a high-level voltage capable of the transfer operation is provided. The transfer operation can be performed within the range of 1.5 to 2 volts on the low voltage side, and within the range up to a voltage defined by a breakdown voltage of the light-emitting element on the high voltage side. When the transfer cell $\phi_2$ goes LOW, the cell 3n is turned off, and the minimal conducting state is shifted from the cell 3n to the cell 3n+1.

As described above, a self-scanning function can be realized without using a resistor for connecting light-emitting elements, and a high-level voltage of the clock pulse capable of the transfer can have a considerable margin, i.e., can be in a range of 1.5 to 2 volts on the low voltage side and a range up to a breakdown voltage of the light-emitting element on the high voltage side.

The structure can operate using clock pulses of four or more phases, as a matter of course. The light-emitting elements may be arranged in a zigzag pattern or may be arranged in two lines from the halfway of the array depending on applications. The present invention is not limited as long as a device having a similar function is used.

FIG. 16 shows a practical structure of FIG. 15. An n-type semiconductor layer 24, a p-type semiconductor layer 23, an n-type semiconductor layer 22, and a p-type semiconductor layer 21 are sequentially formed on a grounded n-type GaAs substrate 19. The resultant structure is patterned into individual light-emitting elements $T_{3n-1}$ to $T_{3n+1}$ by photolithography or the like and etching.

The characteristic feature of this structure is that the main and subsidiary light-emitting elements $T_{3n-1}$ and $S_{3n-1}$, $T_{3n}$ and $S_{3n}$, and $S_{3n+1}$ and $T_{3n+1}$ in the cells have common lower gates or pn portions. The upper gate or pn portion of the subsidiary light-emitting elements $S_{3n-1}$ is connected to that of the next main light-emitting elements $T_{3n}$ through a metal strip as are $S_{3n}$, $T_{3n+1}$ and $S_{3n+1}$, $T_{3n+1}$. The light-emitting elements have anodes connected to resistor strips 40 and upper gates connected to gate metallization 41, and are isolated by an insulating layer 30.

Of the main and subsidiary light-emitting elements T and S, the light-emitting elements S are used as coupling means. Light $L_0$ is output upwardly.

No resistor network is required, and a high-level voltage range of the clock pulse can have a considerable margin, i.e., can be a range of 1.5 to 2 volts on the low voltage side and a range up to a breakdown voltage of the light-emitting element on the high voltage side.

In the above embodiments, the three-phase clock pulses $\phi_1$ to $\phi_3$ are overlapped in time to transfer the minimal conducting state among light-emitting elements. Thus, a luminous point can be sequentially shifted and a light-emitting array capable of self-scanning can be realized.

Figure 17:
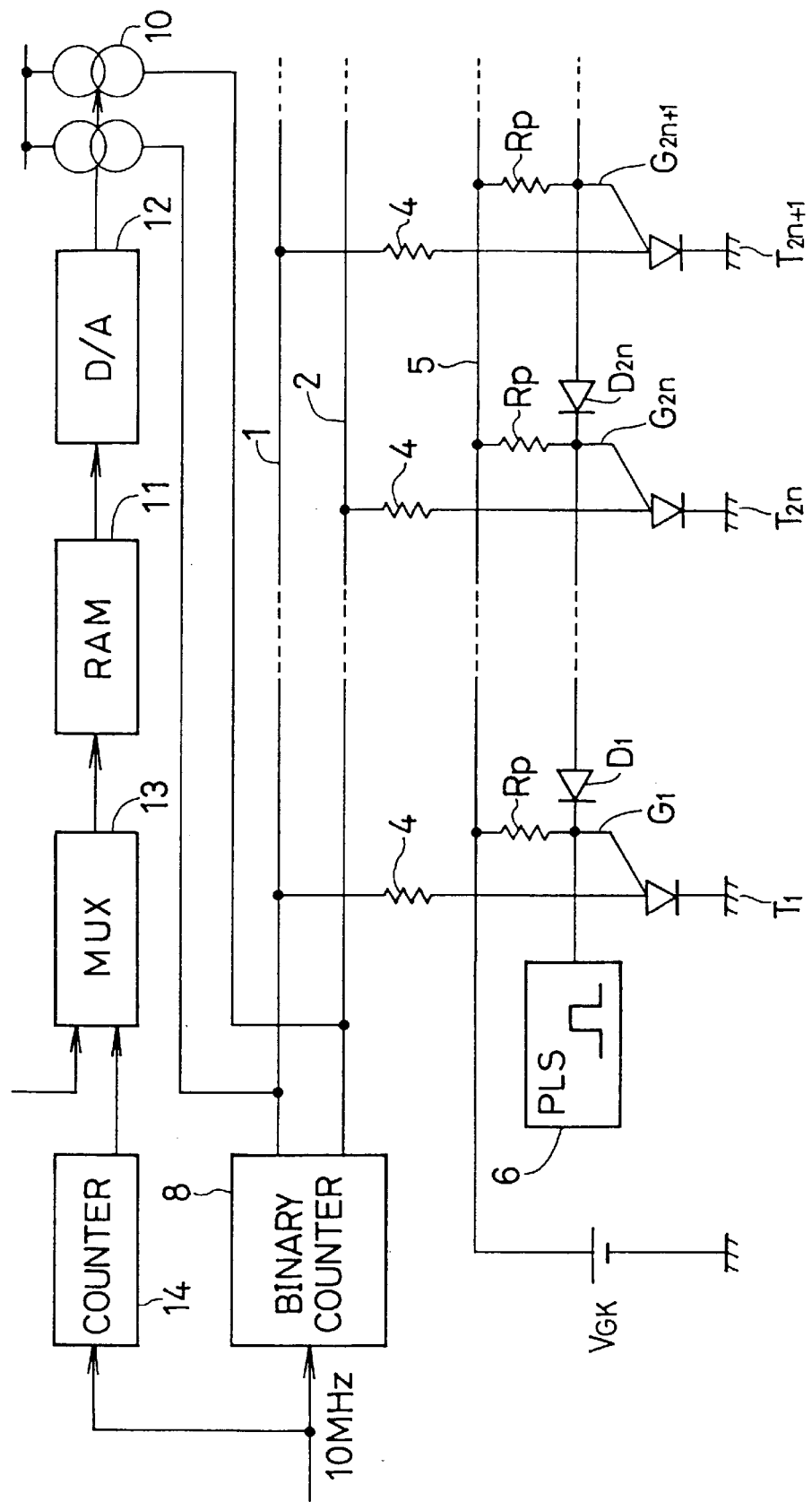
FIG. 17 is a circuit diagram of an array of cells each having a light-emitting element integral with a coupling diode.

Referring now to FIG. 17, a circuit diagram of an array of light-emitting cells is shown. Each of the cells consists of a light-emitting element having an upper gate and a coupling diode as a uni-directional coupling means. The diode integral to the light-emitting element is equivalent to a pnp transistor. Since the diode is coupled between neighboring gates, two-phase clock pulses can be employed to transfer the minimal conducting state among the light-emitting elements.

In FIG. 17, the light-emitting elements $T_{2n-1}$ to $T_{2n+1}$ are arranged or disposed in a line along a longitudinal direction with, for example, a 600 dpi pitch where n is a positive integer. Two-phase transfer lines 1 and 2 are connected to every other anode of the light-emitting elements T through trimming resistors 4. Each of the trimming resistors 4 are laser trimmed to control or adjust its characteristic deviation of the corresponding light-emitting element. Essentially, the transfer line 1 is connected to the anodes of light-emitting elements $T_{2n}$ and the transfer line 2 is connected to the anodes of light-emitting elements $T_{2n-1}$.

Each upper gate G of the light-emitting elements T is connected to a bias line 5 through a corresponding pull-up resistor Rp to receive a bias voltage Van. The upper gates $G_{2n-1}$ (not shown) of light-emitting elements $T_{2n-1}$ (not shown) are coupled to the next gates $G_{2n}$ of the light-emitting thyristors $T_{2n}$ through diodes D, respectively, as well as $G_{2n}$ to $G_{2n+1}$ through diodes D to transfer its minimal conducting state where n is a positive integer. The upper gate of the first light-emitting element $T_1$ is connected to a pulse generator 6 to provide one pulse for a minimal conducting state per a scanning cycle.

A clock circuit includes a binary counter 8 having two-phase outputs connected or ORed to the two transfer lines 1 and 2 through two diodes, or open drain or collector outputs (not shown), respectively, so that at least one of the two-phase clock pulses is applied to the minimal conducting light-emitting thyristor to maintain the minimal conducting transfer. The binary counter 8 receives, for example, a 10 MHz clock signal to provide a 0.1 μs pulse width. Additionally, a current limiting resistor or a diode employing a normal buffer may be connected between each output of the binary counter 8 and the corresponding transfer line 1 or 2.

It is noted that a controllable current source or mirror 10 has two open drain or collector outputs. The open outputs are ORed to the respective transfer lines to supply an analogous current $I_T$ to the minimal conducting light-emitting thyristor to provide a gray scale display thereto. Therefore, the current source includes preferably a multi-output current mirror 10 so that the analogous current $I_T$ is controlled proportional to an image signal during a predetermined period.

For example, 8192 light-emitting elements are assumed to be aligned along a longitudinal direction with a 600 dpi pitch. If one pixel at the nth address should be displayed corresponding to the nth light-emitting element where n is a positive integer, n clock pulses are applied to the transfer lines to transfer the minimal conducting state to the nth light-emitting element, then the additional analogous current from the corresponding current source is supplied thereto.

It is noted that a predetermined wider pulse width of the analogous current than that of the clock pulses is provided. If a 10 MHz frequency of clock pulses is supplied to the counter 8, the pulse width of the analogous current is 1 μs and only the 8191th pixel is displayed, and 8190 clock pulses are applied to the transfer lines with 819 μs and then 1 μs analogous current is applied thereto to reduce the scanning time to 820 μs. Therefore, since about 20% of the 8192 pixel signals have generally non-zero levels, the scanning time of one line is advantageously reduced to about 2.3 ms.

An 8-bit wide 8k RAM buffer 11 is also integrated in the light-emitting array to store the 8k pixel data. The RAM buffer 11 has an 8-bit data input interfaced or connected to the outer peripheral (not shown) and an 8-bit data output connected to a flush type D/A converter 12 whose analog output is in turn connected to an input of the current mirror 10. The 13-bit address input of the RAM buffer 11 are connected through a multiplexer 13 to either the outer peripheral (not shown) or a 13-bit binary counter 14 clocked by the 10 MHz clock pulses.

A zero detector as shown in FIG. 2 is connected to the data outputs of the RAM buffer 11 to provide a count enable signal for a BCD counter as shown in FIG. 2 which causes the clock pulse to extend to 10 times. When zero data on the data input is detected, the BCD counter is disabled. When gray scale data on the data input is detected, the binary counter 8 is disabled to halt or maintain its count status, the BCD counter is enabled to count 10 pulses and then disabled by own its carry output. During the BCD counter is enabled, the D/A converter 12 converts the gray scale data to an analog signal to be supplied to the current mirror 10 that sources an analogous current to the minimal conducting light-emitting element. After receiving the carry output, the binary counter 8 is activated to start the minimal conducting state transfer operation.

Therefore, the clock circuit provides the current enough to maintain a minimal conducting state of any light-emitting element among the many light-emitting elements. The two-phase clock pulses associated with the unidirectional coupling means provide a scanning function of the minimal conducting light-emitting elements. The controllable current mirror 10 provides the analogous current $I_T$ corresponding to a gray scale signal $\phi_I$ to the minimal conducting light-emitting element synchronized with the clock pulse to provide light intensity.

Assume that the clock pulse $\phi_2$ on the line 2 goes HIGH, and the light-emitting element $T_{2n}$ is turned on. The potential of the upper gate $G_{2n}$ is reduced to about 0 volt due to the characteristics of the compound semiconductor element. If the voltage $V_{GK}$ is 5 volts, the gate voltages of the light-emitting elements are determined by the diode network. The gate voltage of the next light-emitting element $T_{2n+1}$ is a voltage drop of the coupling diode $D_{2n}$, and the remaining gate voltages are increased apart from the element $T_{2n}$. However, voltage drops by coupling diodes occur for only the right half of the array from the element $T_{2n}$ due to the unidirectional and asymmetrical characteristics of the diode. More specifically, the gate voltage at the gate $G_{2n+2}$ (not shown) is higher than that of the gate $G_{2n}$ by the two diffusion potential $2V_{df}$ of two serial coupling diodes. Since the threshold voltage of the light-emitting elements is predetermined between diffusion potential $V_{df}$ and $2V_{df}$, only the next element $T_{2n+1}$ is turned on. On the other hand, no gate current flows through the former gates $G_{2n-1}$ (not shown) corresponding to the left half of the array since the corresponding diodes D are reverse-biased, and hence their gate voltages are substantially identical to the bias voltage $V_{GK}$. The next clock pulse $\phi_1$ is applied to every other element $T_{2n-1}$, $T_{2n+1}$, $T_{2n+3}$ and the like. The next element $T_{2n+1}$ except for the element $T_{2n}$ has the lowest threshold voltage, i.e., about $V_{df}$. The next but one element $T_{2n+2}$ has lower threshold voltage, about $2V_{df}$. The threshold voltages of the elements $T_{2n-1}$ and $T_{2n-3}$ are between about $V_{df}$ and $2V_{df}$. In this manner, if the high-level voltage of the clock pulse is set to fall within the range of $V_{df}$ to $2_{Vd}$, only the element $T_{2+1}$ can be turned on, and the transfer operation can be performed.

Figure 18:
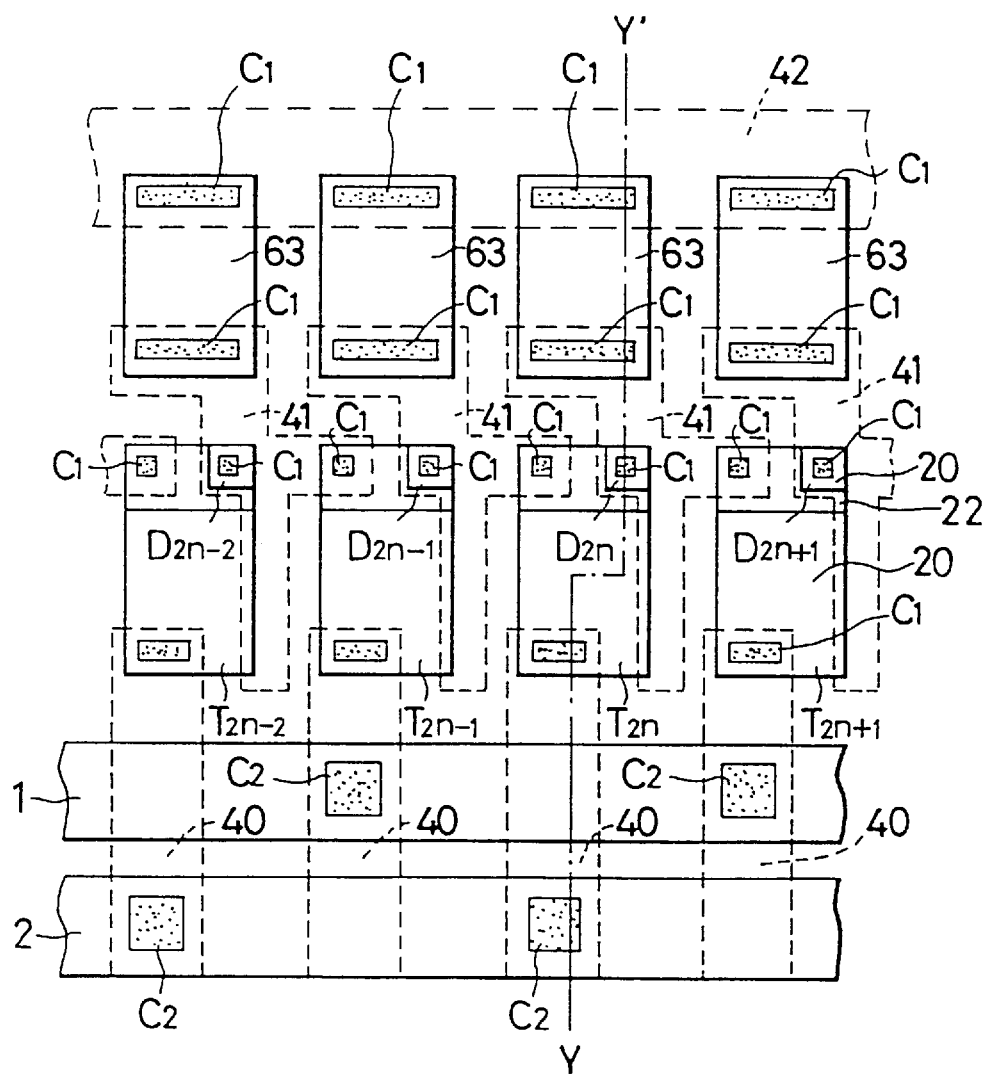
FIGS. 18 and 19 are plan and sectional views, respectively of the array of FIG. 17.
Figure 19:
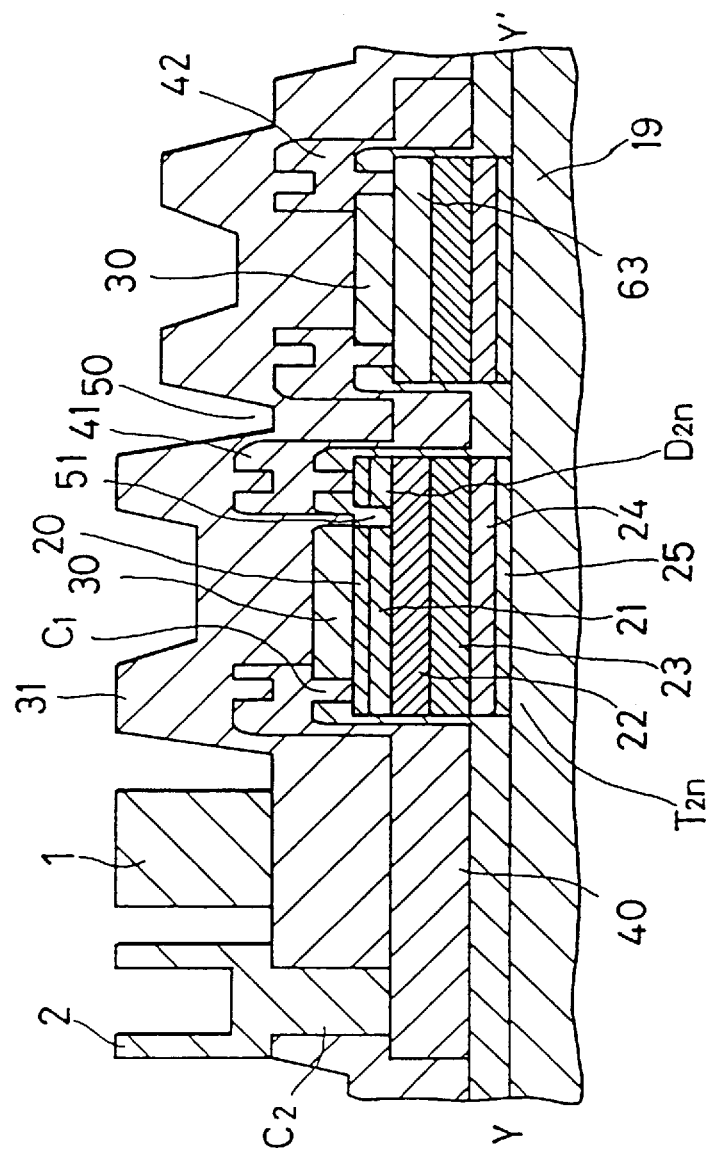

Referring now to FIGS. 18 and 19, the array of light-emitting cells each having a light-emitting element and a diode or pnp transistor is shown.

In the manufacturing process, an n-type semiconductor layer 24 or n-type GaAs and n-type AlGaAs layers 25 and 24, a p-type semiconductor or p-type GaAs layer 23, an n-type semiconductor or n-type GaAs layer 22, and a p-type semiconductor layer 21 or p-type AlGaAs and p-type GaAs layers 21 and 20 are sequentially formed on a grounded n-type GaAs substrate 19 to provide a multilayered structure. Three row grooves 50 each extending along the longitudinal direction and having a bottom of the substrate are etched on the structure to partition or isolate the top resistor region, the middle cell region and the bottom transfer line region.

A plurality of column grooves 51 each having a depth identical to those of the row grooves are then formed by photolithography and etching to isolate the light-emitting cells or thyristors $T_{2n-1}$ to $T_{2n+1}$ where n is a positive integer. In each cell, an L-shaped groove 52 having the layer 22 is formed to isolate the light-emitting thyristor T and the coupling diode D. The resistors Rp are formed in the same process as that of the L-shaped grooves 52.

An insulating layer 30 is formed on the entire surface of the grooved structure to prevent short-circuiting between the cells and wirings, and serves as a protection film for preventing deterioration of their characteristics. In the layer 30, contact holes $C_1$ are provided so that resistor strips 40 have an ohmic contact with the corresponding anode or p-type GaAs layers 20, and gate metallizations 41 have an ohmic contact with the 4 corresponding gate or n-type GaAs layers 22.

The insulating layer 30 is preferably formed of a transparent material allowing the passage of light having a wavelength of a light-emitting thyristor. The n-type GaAs substrate 19 serves as a cathode of each thyristor. Each of two transfer lines 1 and 2 is sequentially connected to the anodes of every other individual light-emitting thyristor through trimming resistors 40. The pull-up resistor Rp formed by the n-type GaAs layer 22 is connected to each gate of the light-emitting thyristors.

Each metal strip for the gate wiring partially extends into the groove between adjacent light-emitting thyristors to prevent light coupling that may influence the transfer operation. Further, the high-level periods of the clock pulses $\phi_1$ and $\phi_2$ are set to slightly overlap alternately each other so that the minimal conducting state among the light-emitting thyristors is sequentially transferred. In this case, two AND-OR gates may be are added before the binary counter 8.

The binary counter 8 may include a T-type flip-flop having Q and Q* (inverted Q) outputs and T clock input toggled by a positive going edge of the 10 MHz clock pulse. The Q output of the flip-flop is connected to an input of a two input OR gate whose output corresponds to the clock pulse $\phi_1$. Another input of the OR gate is an output of a two input AND gate whose inputs are 10 MHz clock pulses and the Q* output. The Q* output of the flip-flop is connected to an input of a two input OR gate whose output corresponds to the clock pulse $\phi_2$. Another input of the OR gate is an output of a two input AND gate whose inputs are 10 MHz clock pulses and the Q output.

A luminous point is sequentially transferred. A two-phase drive self-scanning light-emitting array can be realized by an integrated circuit.

The anode of each diode is connected to the gate of the next light-emitting thyristor and the pull-up resistor Rp.

Contact holes $C_2$ connect the anodes of the light-emitting thyristors to the transfer lines 1 and 2 through trimming resistors 40. A bias line 5 is connected to a bias voltage $V_{GK}$ and the pull-up resistors Rp. The bias line 5 is formed simultaneously with gate metallization 41. Note that the gate metallization 41 also serves as shading a layer for preventing the light-emitting thyristors $T_{2n-1}$ to $T_{2n+1}$ from mutually influencing their light emission. Each pull-up resistor Rp may be formed of another layer or the p-type GaAs layer 23 or may be formed as another resistor region.

It is noted that the transfer lines 1 and 2 are formed before the resistor strips 40 are formed although not shown in FIGS. 18 and 19.

It is noted that a diode for performing electrical coupling is formed by using a portion of a light-emitting thyristor, so that a diode can be formed in the same process as that of the light-emitting thyristor.

In FIG. 17, the two-phase light-emitting array having the diode network may omit the bias line and the pull-up resistors, because the minimum on light-emitting element has almost zero volts on its upper gate thereby causing the next light-emitting element to minimally turn on. The OFF state light-emitting elements have almost clock voltages each subtracted by the forward voltage of the diode of its upper gates upon the application of high-level clock voltages thereby not causing the next light-emitting element to turn on.

Figure 20:
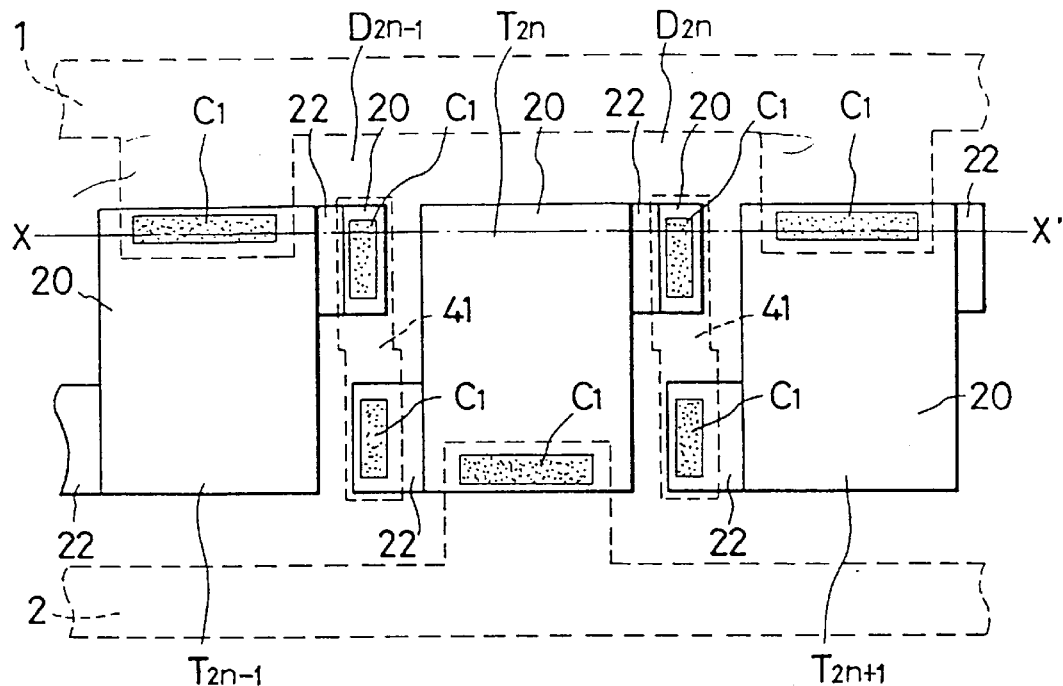
FIGS. 20 and 21 are plan and sectional views, respectively of a modified light-emitting thyristors, array of FIG. 17.
Figure 21:
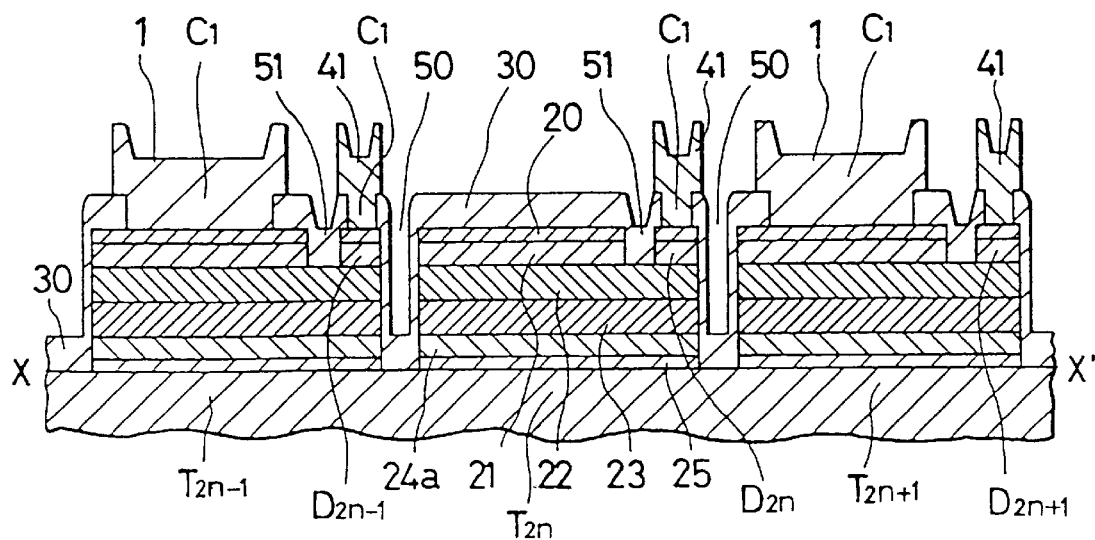

In FIGS. 20 and 21, transfer lines 1 and 2, and light-emitting thyristors $T_{2n-1}$ to $T_{2n+1}$ are identical to those described above. Each gate metallization 41 connects coupling diode D to the gate of the next light-emitting thyristor.

It is noted that the respective transfer line includes a plurality of trimming branches each connected to an anode through a contact hole. Each trimming branch is laser trimmed after assembling the array.

As wiring patterns of the transfer lines and metallization can be formed without overlapping, only one wiring layer need be formed. Since pull-up resistors can be omitted, the manufacturing process can be simplified, and thus, manufacturing cost can be further decreased.

The structure can be equivalently constituted by using transistors.

Figure 22:
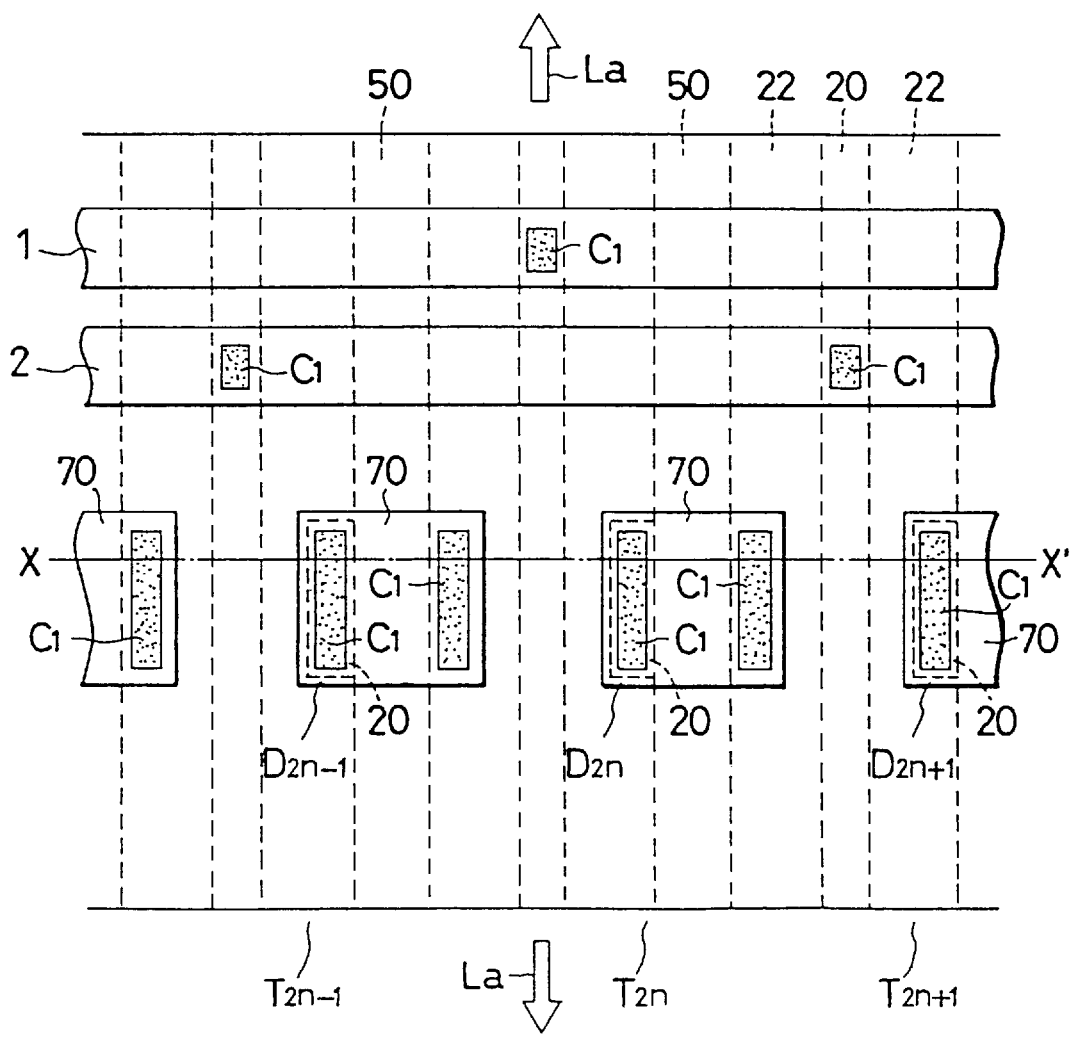
FIGS. 22 and 23 are plan and sectional views, respectively of a modified laser thyristors' array of FIG. 17.
Figure 23:
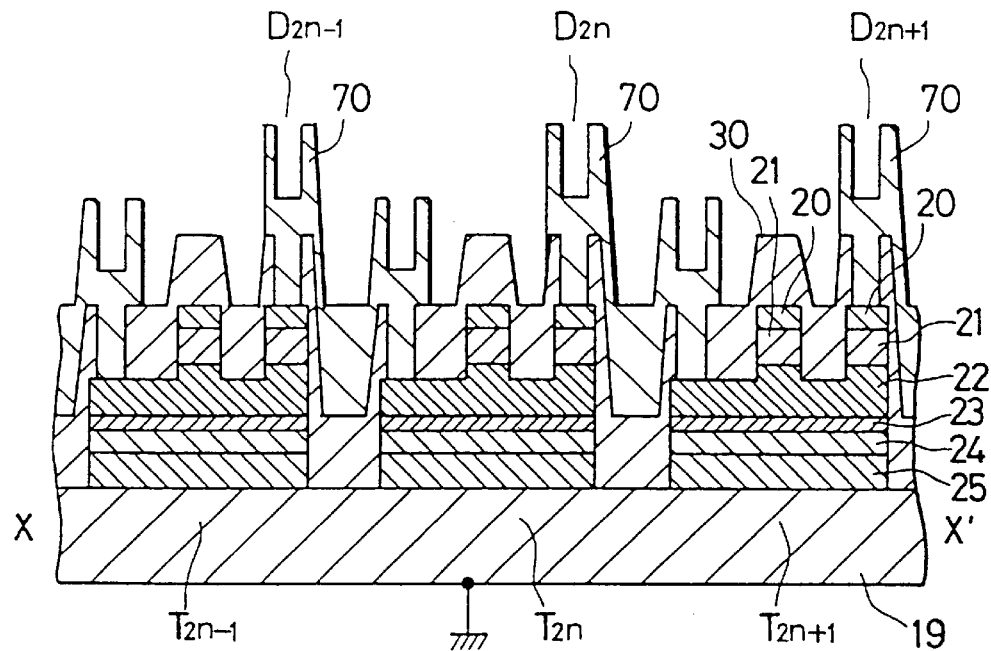

In FIGS. 22 and 23, an array of laser thyristors each integral with a coupling diode without pull-up resistors is shown.

A manufacturing method for the above structure will be briefly described. An n-type AlGaAs layer 25, a p-type AlGaAs layer 24, an i-type GaAs layer 23, an n-type AlGaAs layer 22, a p-type AlGaAs layer 21, and an anode layer 20 are sequentially stacked on an n-type GaAs substrate 19.

The anode layer 20 is then photoetched into a rectangular shape having the same width as that of the n-type AlGaAs layer 25 in FIG. 23. Using the anode pattern 20 as a mask, the p-type AlGaAs layer 21 to the n-type AlGaAs layer 25 are etched to form thyristor column grooves 51. The anode pattern 20 is further etched into a stripe pattern (current injection portion of a laser thyristor) having a width of 10 $\mu$m or less and a coupling laser diode pattern ($D_{2n-1}$ to $D_{2n+1}$ portions). Using these patterns as masks, the p-type AlGaAs layer 21 and the n-type AlGaAs layer 22 are etched. The n-type AlGaAs layer 22 is not entirely removed but is partially left.

Thereafter, an insulating film 30 is formed. The insulating film preferably has insulating and shading functions. When an $SiO_2$ is used as the insulating film, it may allow light having a wavelength of 870 nm to pass therethrough to induce the light coupling. Thus, a shading film of a light absorption material such as amorphous silicon must be sandwiched between the $SiO_2$ films. Contact holes $C_1$ are formed by photoetching. A metal layer is formed by deposition or sputtering to provide the transfer lines 1 and 2 by photoetching. Finally, the end face of a laser beam output side is formed by cleavage or the like to have good parallelness.

It is noted that the respective transfer line includes a plurality of trimming branches each connected to the anode through the contact hole. Each trimming branch is laser trimmed after assembling the array.

In the above embodiments, if p-type and n-type layers are reversed, the structure can operate as described above if a bias condition and the like are reversed. Such a modification is also included in the scope of the present invention. In a two-dimensional light-emitting array, light-emitting thyristors are connected to four or six or more light-emitting thyristors through electrical means.

Neither bias nor pull-up resistors are required, and the wiring layers for the two clock pulses need only be formed, resulting in a simple structure.

The number of phases can be increased to three or four to achieve a more stable transfer operation.

Figure 24:
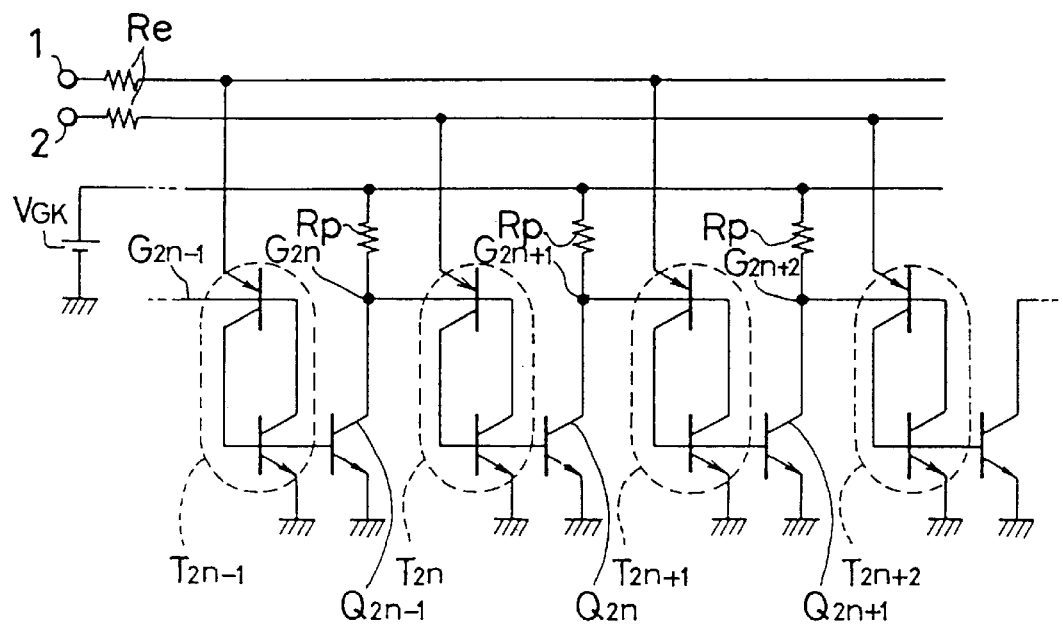
FIG. 24 is a circuit diagram of an array of cells each having a light-emitting element and a transistor.

FIG. 24 shows an array of light-emitting cells each consisting of a typical light-emitting thyristor and an npn transistor. In each cell, the base of the transistor is connected to the lower gate of light-emitting thyristor to constitute a current-mirror. The light-emitting cells or thyristors $T_{2n-1}$ to $T_{2n+1}$ are aligned in a line with a predetermined pitch, and have upper gates $G_{2n-1}$ to $G_{2n+1}$, each connected to the collector of the former npn transistor and connected to bias voltage $V_{GK}$ through a pull-up resistor Rp. Each of two transfer lines 1 and 2 is connected to the anode of every other light-emitting thyristor. Each transfer line has a resistor Re for restricting a current of the transfer line.

If the clock pulse $\phi_2$ goes HIGH and the light-emitting thyristor $T_2n$ is turned on, the potential at the gate $G_{2n}$ is reduced to almost 0 volts due to the characteristics thereof. If the bias voltage $V_{GK}$ is 5 volts, its gate $G_{2n}$ and anode will sink currents through the resistors Rp and Re to cause the npn transistor $Q_{2n}$ to turn on. The collector of the transistor $Q_{2n}$ current sinks through the next pull-up resistor Rp and become to sink as a source current from the upper gate $G_{2n+1}$ of the next light-emitting thyristor $T_{2n+1}$. By appropriately adjusting the drive power of the transistor Q, the potential of the upper gate $G_{2n+1}$ can be reduced to almost zero. When the clock pulse $\phi_1$ goes HIGH, the anode of the light-emitting thyristor $T_{2n+1}$ sinks the current through the resistor Re to minimally turn on itself. Thus, a minimal conducting state can be transferred to the light-emitting thyristor $T_{2n+1}$ if the voltage of the clock pulse $\phi_1$ is higher than the diffusion potential $V_{df}$.

In this manner, the threshold voltage of the light-emitting thyristor $T_{2n+1}$ is decreased, while the threshold voltage of the light-emitting thyristor $T_{2n-1}$ located on the back side is not changed. Even if the potential at the gate $G_{2n}$ is reduced to almost zero, the voltage of the gate $G_{2n-1}$ or determining the threshold voltage of the light-emitting thyristor $T_{2n-1}$ is not influenced thereby.

As described above, the light-emitting array using the current-mirrors is operated by clock pulses ranging from $V_{df}$ to $V_{GK}+V_{df}$, and can be operated with a wide voltage margin of $V_{GK}$.

Figure 25:
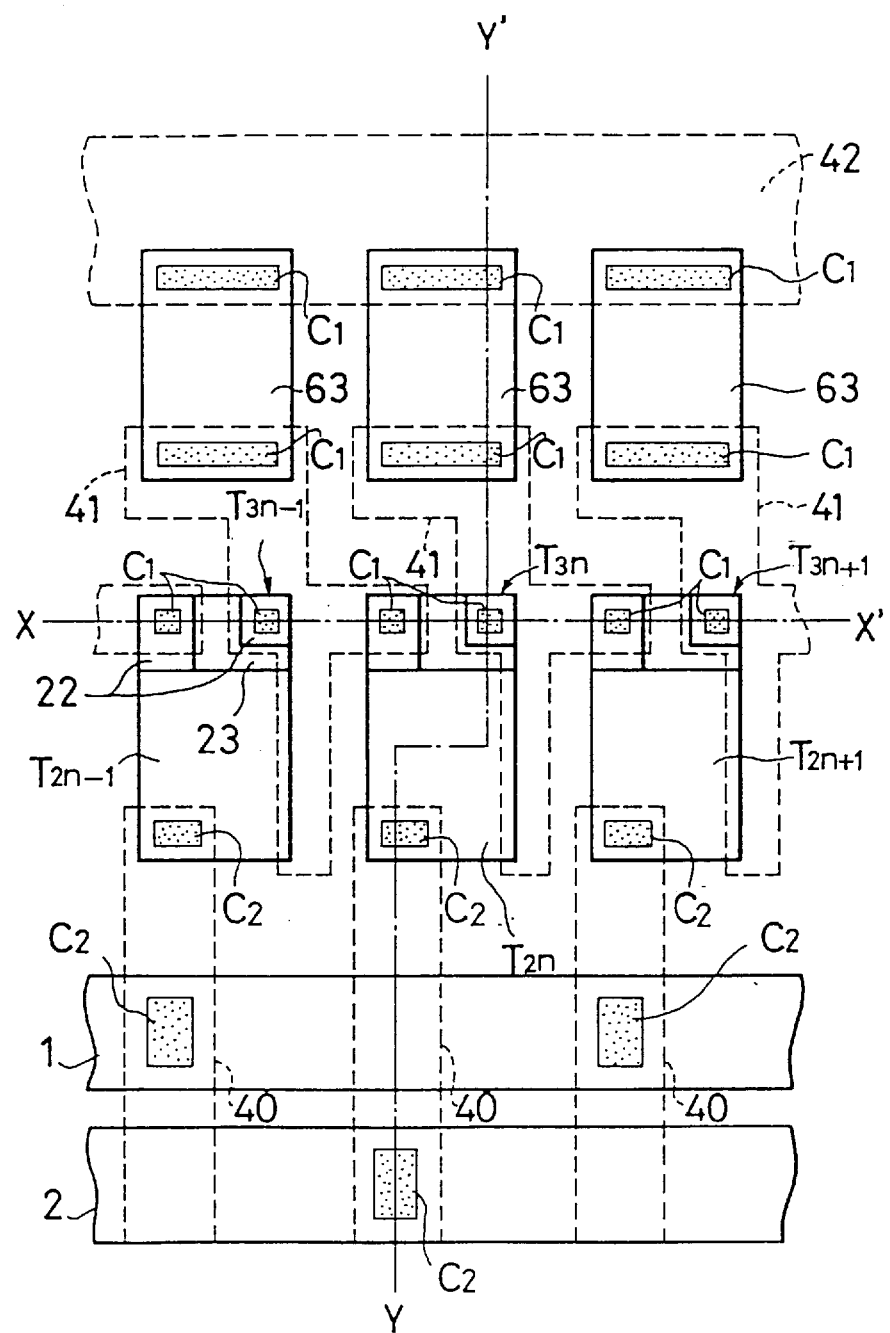
FIG. 25 is a plan view of FIG. 24.
Figure 26:
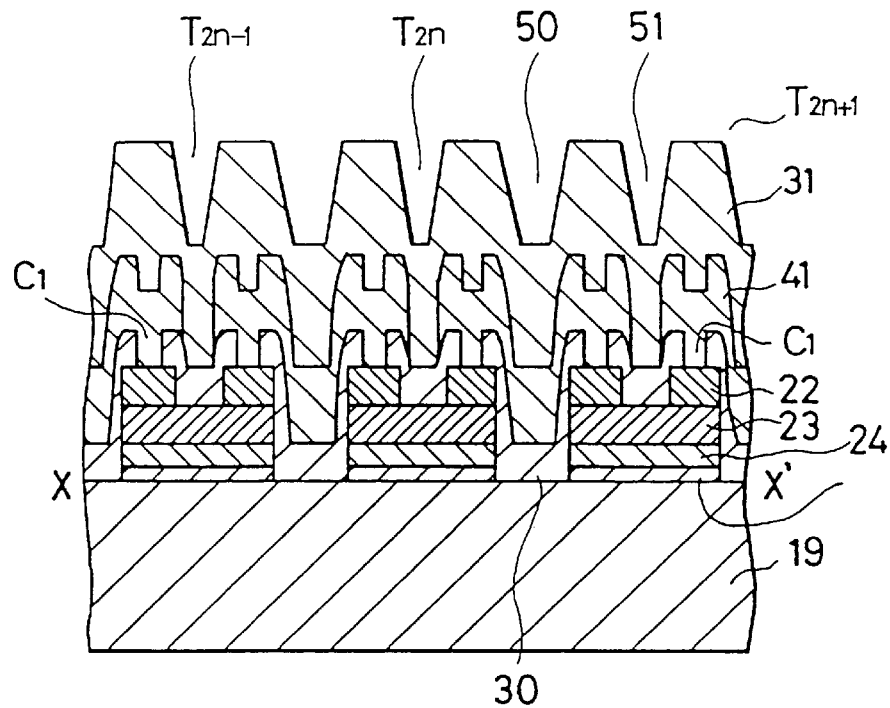
FIGS. 26 and 27 are sectional views taken along lines X–X' and Y–Y' in FIG. 25.
Figure 27:
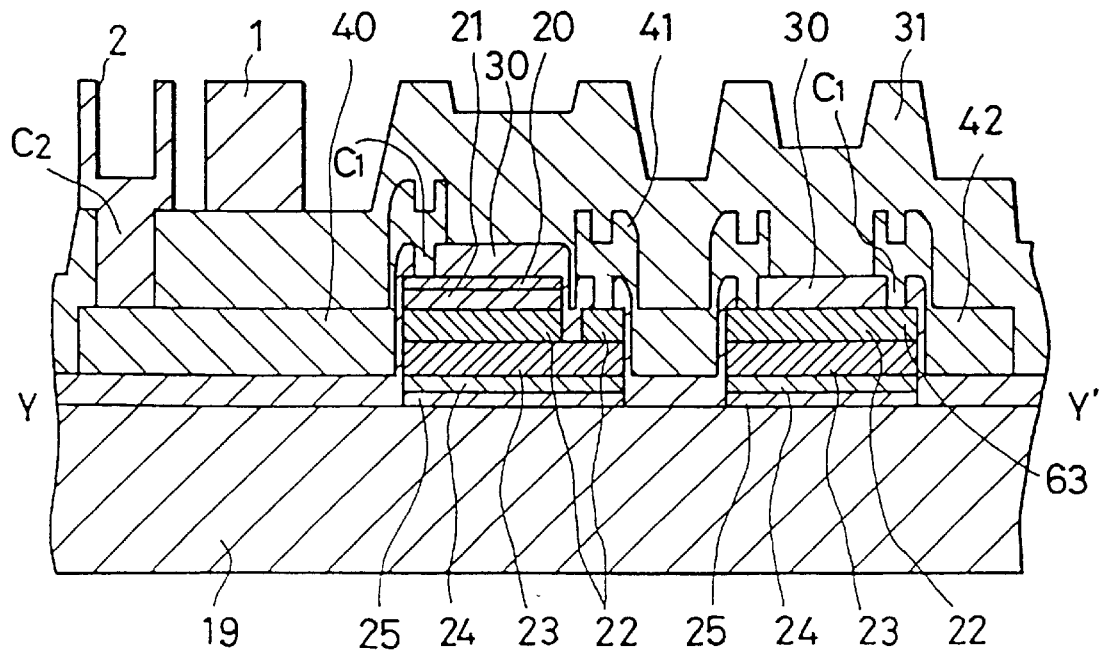

FIGS. 25 to 27 present a practical structure of FIG. 24.

Each pull-up resistor Rp is formed by a compound semiconductor layer. The collectors of current-mirror transistors $Q_{2n-1}$ to $Q_{2n+1}$ are connected to gate metallization 41 through contact holes $C_1$. The contact holes $C_1$ connect the semiconductor layers to the metallization. Resistor strips 40 for the light-emitting thyristors are connected to transfer lines 1 and 2 through contact holes $C_2$. A bias line 42 is connected to a bias voltage $V_{GK}$, and is connected to the pull-up resistors 63.

The bias line 42 is formed simultaneously with the gate metallization 41. The gate metallization 41 also serves as shading layers for preventing the light-emitting thyristors from mutually influencing their light emission.

FIG. 26 and 27 are sectional views taken along lines X–X' and Y–Y' of FIG. 25, respectively. The light-emitting thyristors are formed as follows. An n-type GaAs layer 25, an n-type AlGaAs layer 24, a p-type GaAs layer 23, an n-type GaAs layer 22, a p-type AlGaAs layer 21, and a p-type GaAs layer 20 are sequentially formed on an n-type GaAs substrate 19. Row grooves 50 for isolating the resultant structure into individual light-emitting thyristors are formed by photolithography or the like and etching.

A top shoulder portion in each cell is provided by removing the corresponding p-type GaAs layer 20 and the p-type AlGaAs layer 21 to provide the gate of the light-emitting thyristor. Simultaneously, the p-type layers 21 and 20 in the resistor region are removed to expose the n-type Gabs layer 22 serving as the pull-up resistors. Further, an L-shaped groove 52 having a bottom of the layer 23 in each cell is etched to provide a collector of the npn transistor. The pull-up resistors may be formed of another layer or the p-type GaAs layer 23 or another 4 resistor region.

The insulating films 30 are formed on the entire structure, and the contact holes $C_1$ are formed therein to expose gates and collectors of the cells and resistor ends. Thereafter, the metal transfer lines 1 and 2, gate metallization 41 and bias metallization 42 are formed. The insulating films 31 are formed, and the contact holes $C_2$ are formed. Thereafter the trimming resistor strips 40 are formed.

Referring now to FIGS. 28 to 36, an array of laser thyristors and another array of beam deflectors are shown to provide a composite array.

Figure 28:
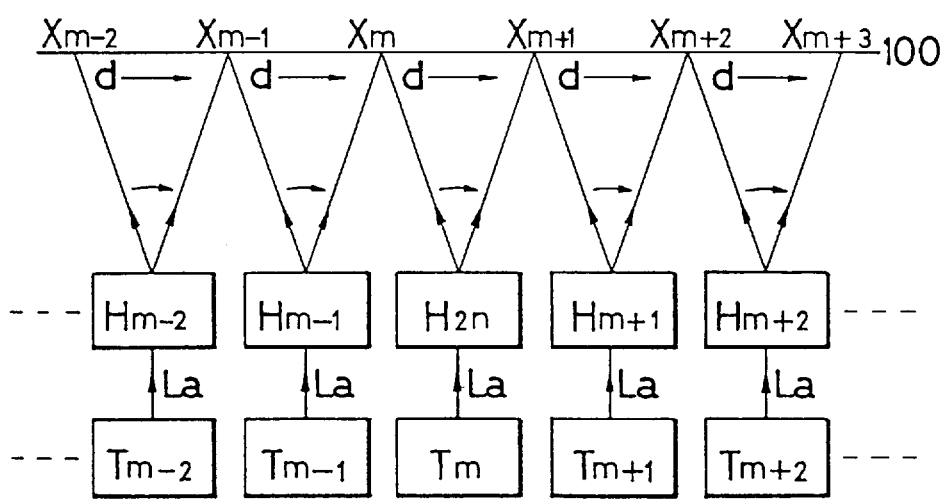
FIG. 28 is a block diagram of an array of laser thyristors and another array of beam deflectors.

In FIG. 28, the laser thyristors Tm are linearly arranged with, for example, a 300 dpi pitch where m is a positive integer. The beam deflectors are Hm each capable of deflecting a light beam emitted from the laser thyristor Tm and are disposed in front of the laser thyristor Tm to constitute a composite array.

In the basic operation of the composite array, three-phase or two-phase clock pulses are assumed to be provided through the transfer lines to minimally turn on the laser thyristor Tm and the beam deflector Hm. The beam deflector Hm receives a light beam from the laser thyristor Tm and emits to a point Xm on a light-receiving surface 100. Control is made such that the beam deflector Hm starts a deflection operation synchronized with a current value supplied to the minimal conducting laser thyristor Tm. A deflection beam having various levels from the beam deflector Hm is moved in a direction of an arrow d, and reaches an end Xm+1 on the light-receiving surface 100. At the same time, the beam deflector Hm causes the next beam deflector Hm+1 to minimally turn on as well as the next laser thyristor Tm+1. In this case, adjustment is made to cause the position of a light spot formed by the deflected light beam radiated at the end Xm+1 to coincide with the spot position of the deflection start point Xm+1 of the next beam deflector Hm+1.

Thus, if similar a setting and control are made, continuous, wide-range optical scanning can be realized by this system. If the resolution of the beam deflectors H is represented by N, accuracy can be increased by N times without increasing the number of laser thyristors.

If the laser thyristors have a 300 dpi pitch and N is 8, 2400 dpi pitch of the composite array is realized. Therefore, if N>2, accuracy can be improved as compared to an array including only the 2N laser thyristors. Thus, even though the resolution of the beam deflector is not so high, a remarkable effect can be obtained.

Figure 29:
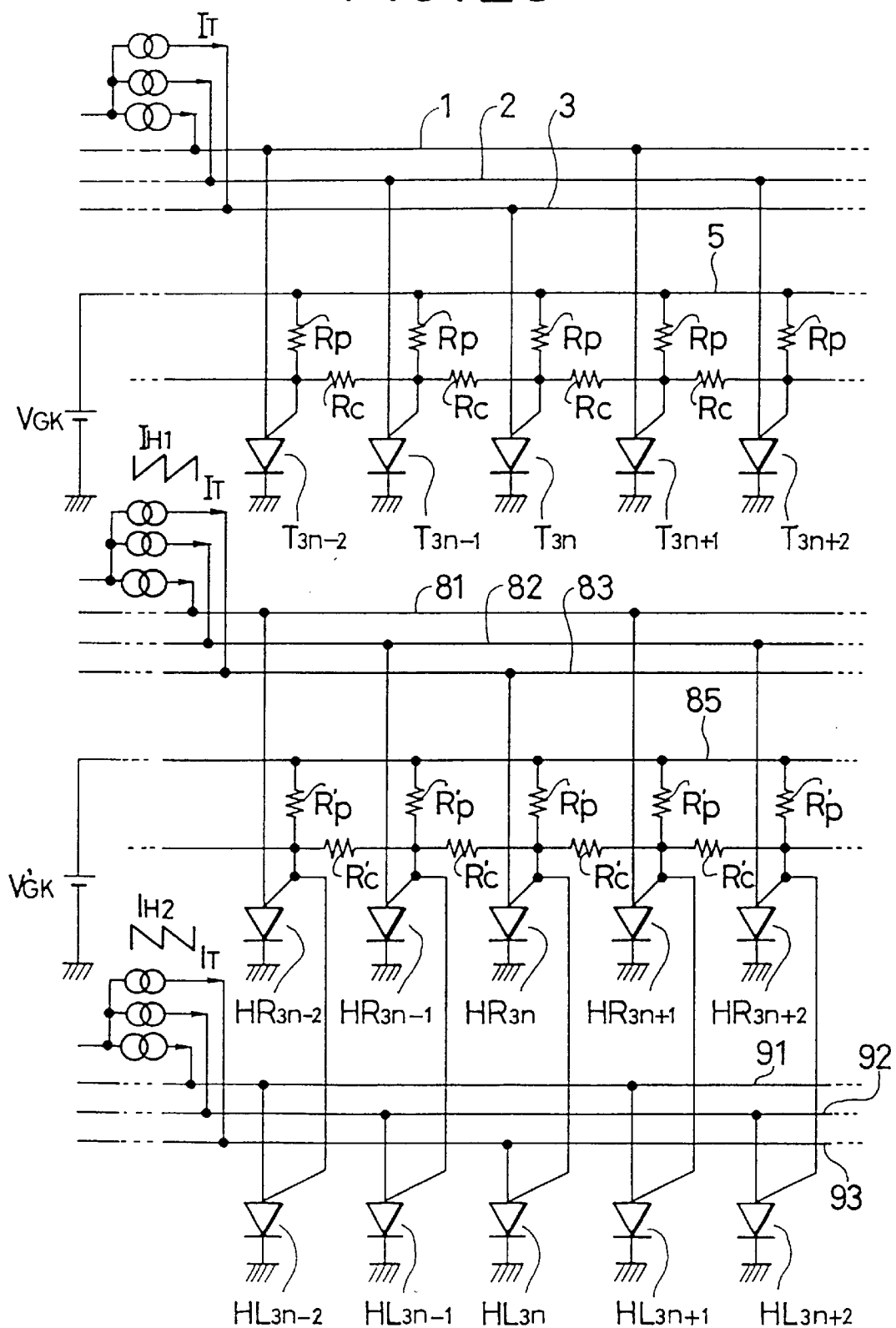
FIG. 29 is an equivalent circuit diagram of FIG. 28.

In FIG. 29, anodes of laser thyristors T are connected to three transfer lines 1 to 3 through respective trimming resistors (not shown) in every third fashion. Each gate of the laser thyristor T is connected to the next through the corresponding coupling resistor Rc and to a bias line 5 through a pull-up resistor Rp in the same manner as in FIG. 2. A plurality of beam deflectors H each consisting of beam deflectors HL and HR have gates each electrically connected to another bias line 85 through another pull-up resistor R'p and to the next through resistors R'c. The beam deflectors HL have anodes connected to transfer line 81 to 83 in every third fashion. The remaining beam deflectors HR have anodes connected to outputs of a current source through transfer line 91 to 93 in every third fashion.

The transfer line 1, 81 and 91 are connected to a first output of a clock circuit (not shown) through multi-open collector or drain outputs each having a current limiter to provide coherent or separated clock pulse $\phi_1$. The other transfer line 2, 82 and 92 are connected to a second output of the clock circuit through multi-open collector or drain outputs each having a current limiter to provide coherent or separated clock pulse $\phi_2$. The further transfer line 3, 83 and 93 are connected to a third output of the clock circuit through multi-open collector or drain outputs each having a current limiter to provide coherent or separated clock pulse $\phi_3$.

These laser thyristors T and the beam deflectors HL and HR also have anodes connected to respective sets of lines 1 to 3, 81 to 83 and 91 to 93 in every third fashion so that an analogous current $I_T$ controlled by a gray scale signal $\phi_I$ flows in the minimal conducting laser thyristor and ramp currents $I_{T1}$ and $I_{T2}$ controlled by deflection signals $I_{HR}$ and $I_{HL}$ flow in the minimal conducting beam deflectors.

Figure 30:
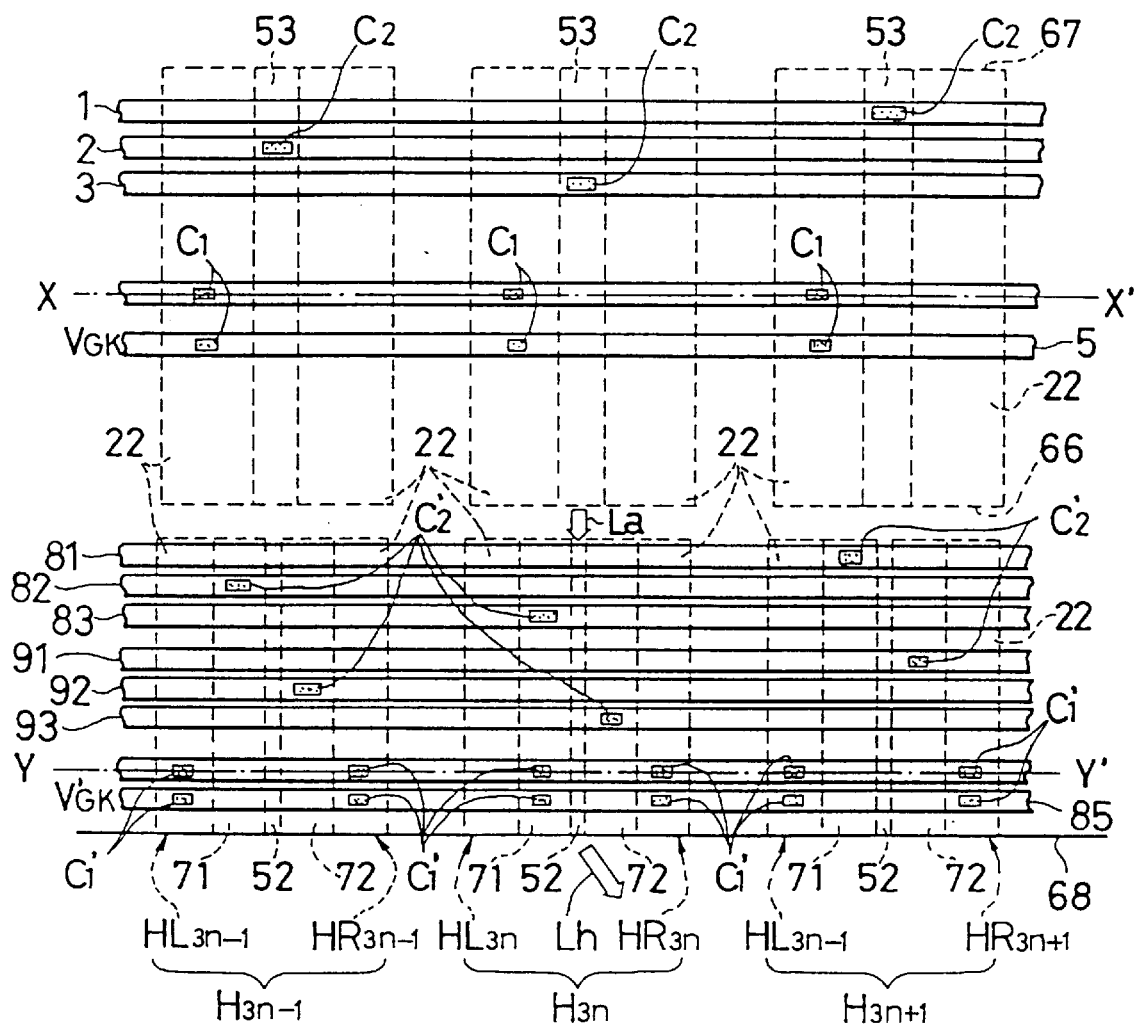
FIG. 30 is a partial plan view of FIG. 29.
Figure 31:
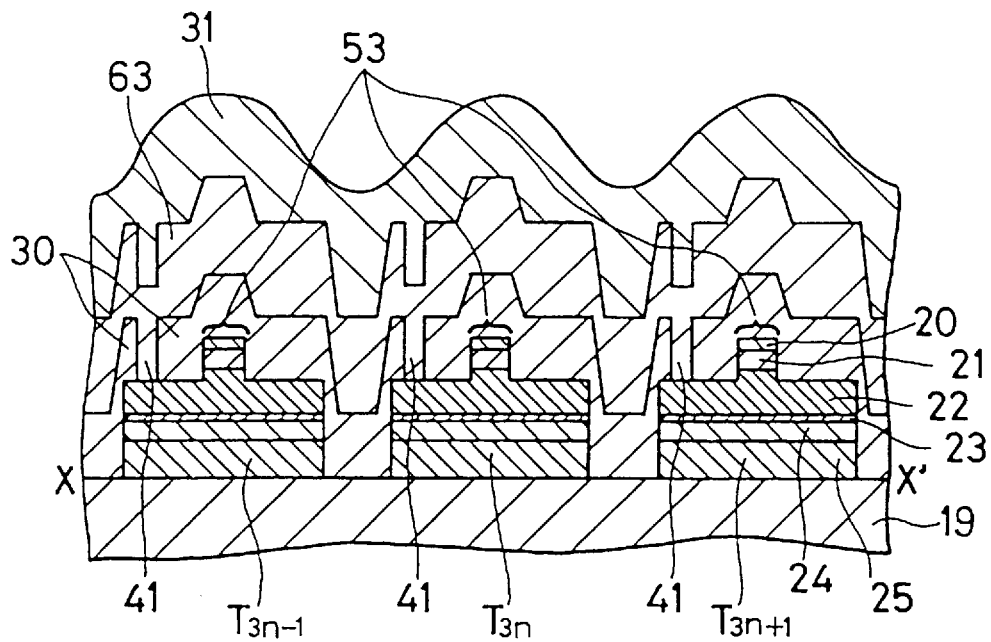
FIG. 31 is a sectional view of a laser thyristor portion.
Figure 32:
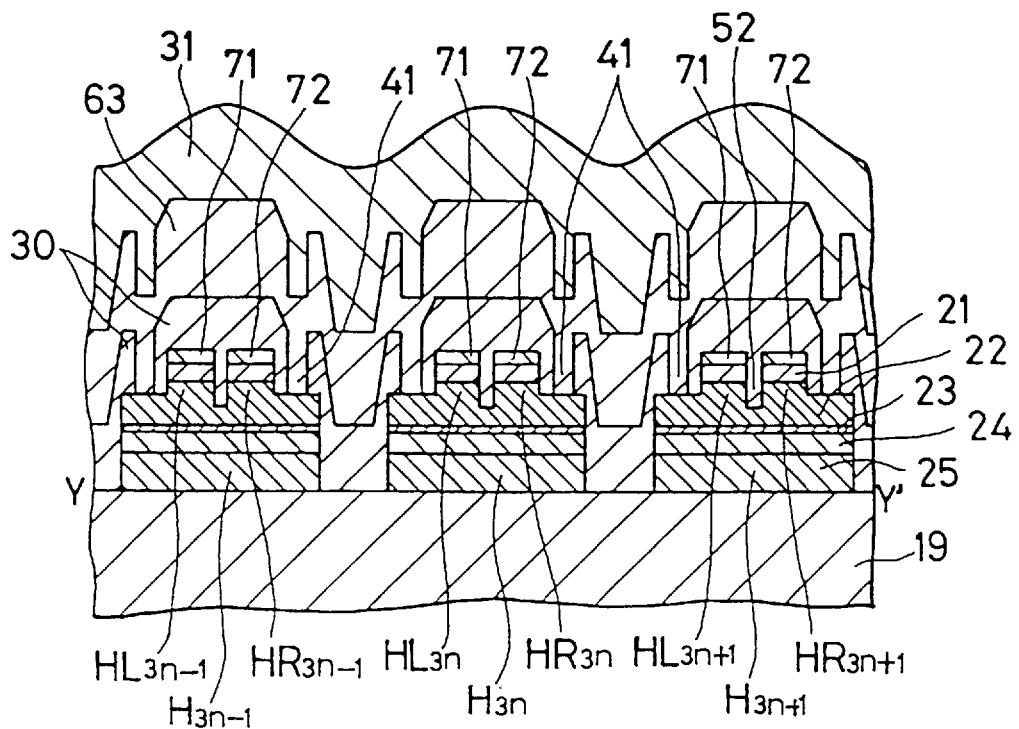
FIG. 32 is a sectional view of a beam deflector portion.

FIG. 30 is a partial plan view of the composite array shown in FIG. 29. It is noted that the respective transfer line includes a plurality of trimming branches each connected to an anode thereof through a contact hole. Each trimming branch is laser trimmed after assembling the array. A different electrical wiring pattern may be employed as long as laser output beams La from the laser thyristors T are efficiently incident on the beam deflectors H. The coupling resistors RC may be replaced with diodes as well as two transfer lines. FIGS. 31 and 32 show sectional structures corresponding to an AlGaAs/GaAs-laser thyristor array portion T (X–X' in FIG. 30), and a beam deflector portion H (Y–Y' in FIG. 30).

The device structure of the composite thyristor will be briefly described. The laser thyristor T and the beam deflector H have a common crystal layer structure. To simplify the manufacturing process, a common crystal layer is preferably used. An appropriate n-type GaAs buffer layer (not shown in FIG. 31) is formed on an n-type GaAs substrate 19. An n-type AlGaAs layer 25, a p-type AlGaAs layer 24, an i-type GaAs layer 23 serving as an active layer of the laser, an n-type AlGaAs layer 22, and a p-type AlGaAs layer 21 are sequentially formed on the buffer layer. A p-type GaAs layer may be formed as an uppermost contact layer on the resultant structure. The AlGaAs layers 22 and 24 formed on the two major surfaces of the layer 23 serve as cladding layers. In the laser thyristor T, ridges 53 are formed by partially removing uppermost layer 21 to the halfway of the upper cladding layer 22. A burying structure may be used in the laser structure. The gate metallization 41 is formed on the n-type AlGaAs layer 22 serving as the upper cladding layer. An end face 66 (FIG. 30) on the side of the beam deflector H of an optical resonator of the laser thyristor T is formed by, e.g., dry etching. The other end face 67 may be formed by a cleavage method.

The beam deflector H is constituted by the same multi-layered structure as that of the laser thyristor T. The beam deflectors HL and HR are arranged at symmetrical positions with respect to a light propagation direction, and have the same thyristor structures as that of the laser thyristor T. In each cell, the p-type AlGaAs layers 21 immediately under anodes 71 and 72 are isolated by a groove 52 to prevent a lateral current. The gate metallization 41 is formed on the n-type AlGaAs layer 22 by removing the upper layers in the same manner as in the laser thyristor portion. Each beam deflector H is arranged at a position capable of efficiently receiving a beam La output from the laser. However, the laser and the beam deflector must be electrically isolated.

Figure 33:
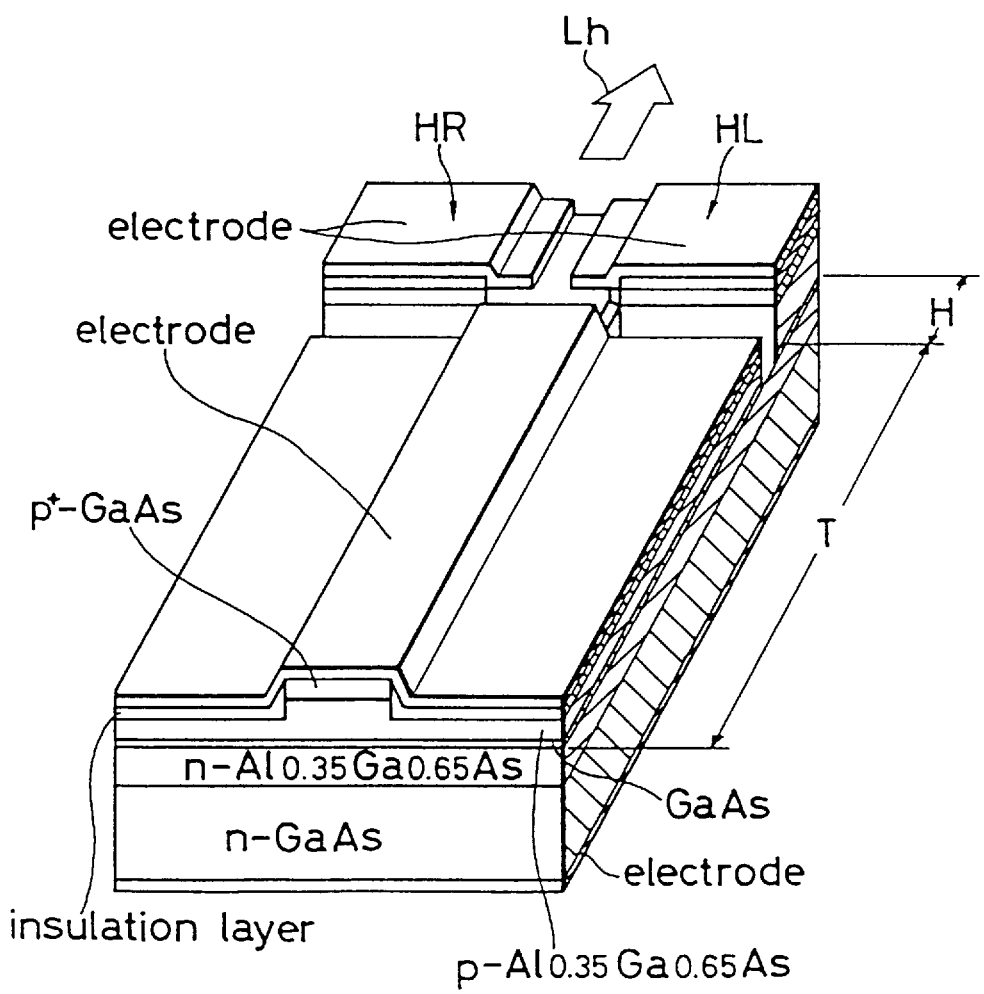
FIG. 33 is a perspective view of the laser thyristor portion and the beam deflector portion.
Figure 34:
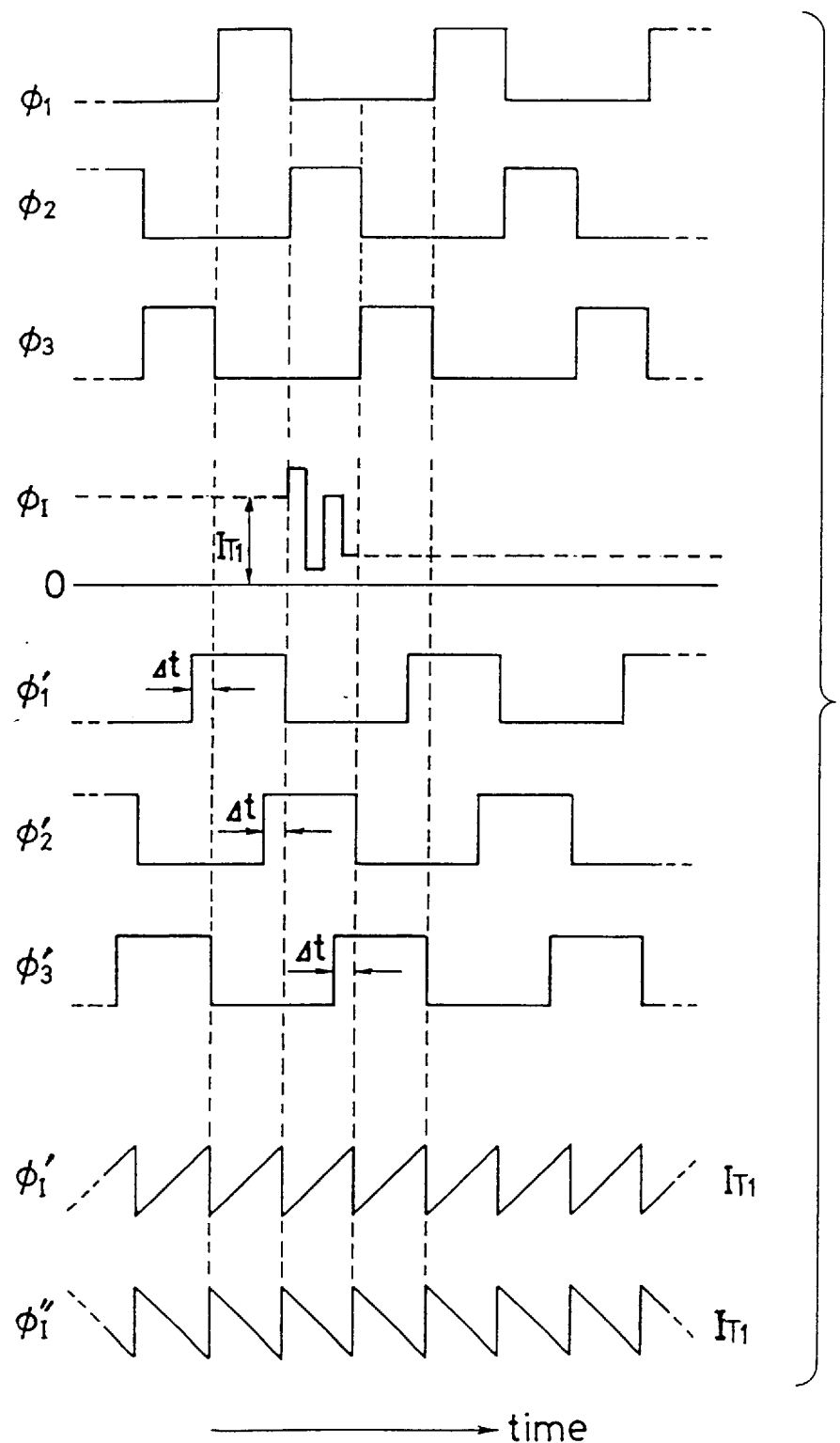
FIG. 34 is a drive timing chart.

FIG. 33 is a perspective view of an AlGaAs/GaAs-composite thyristor having a light deflection function described in the article (Electronic Letters, Vol. 23, pp. 361 (1987). Two anodes are arranged at two sides of a semiconductor waveguide along which a laser beam output from a semiconductor laser propagates, and currents having asymmetrical magnitude are injected into these anodes, so that a refractive index of a waveguide portion is caused to have a gradient, thus, performing light deflection.

A semiconductor laser having good beam convergence is employed as a laser thyristor T. Since threshold current control is performed, a laser thyristor is used. A beam deflector H employs a device using current, injection in the above-mentioned article, two anodes are constituted by thyristors to achieve control by an external signal.

Crystal growth used in the above thyristor formation can be achieved by LP-CVD, MO-CVD, or MBE. Since the laser employs a GaAs active layer, the light-emitting wavelength is about 900 nm. If AlGaAs is used, the wavelength can be shortened to about 780 nm, while if InGaP or AlGaInP is used, it can be shortened to the order of 600 nm. These materials may be selected depending on the applications.

A drive method of the optical scanning composite thyristor will be described below. Under the connection relationship shown in FIG. 29, clock pulses are sequentially applied to the laser thyristors $T_{3n-1}$, $T_{3n}$ and $T_{3n+1}$ through the lines 2, 3 and 1 at timings shown in FIG. 34. A laser drive current is supplied from the line $\phi_I$ to turn on and scan each laser. Pulses which rise earlier by $\Delta t$ than the clock pulses are sequentially applied to pairs of beam deflectors $HL_{3n-1}$, $HR_{3n-1}$, $HL_{3n}$, $HR_{3n}$, $HL_{3n+1}$ and $HR_{3n+1}$ through lines 81, 91, 82, 92, 83 and 93. For example, the clock pulse is applied to the line 3, and pulses are applied to the two beam deflectors $HL_{3n}$ and $HR_{3n}$ from the lines 83 and 93 immediately before the laser $T_{3n}$ is turned on, so that these thyristors are turned on. When the laser thyristor $T_{3n}$, is minimally turned on, symmetrical ramp signals $I_{T1}$ and $I_{T2}$ are applied from the lines 81 and 92 to the beam deflectors $HL_{3n}$ and HR3n. The clock pulse becomes zero when the next clock pulse is sent to the line 1, and the ramp currents are returned to the initial values. Thus, the beam deflectors $HL_{3n}$, and $HR_{3n}$ are turned off. At this time, the beam deflectors $HL_{3n+1}$ and $HR_{3n+1}$ of the adjacent beam deflector $H_{3n+1}$ have already been minimally turned on, and start a deflection operation when the adjacent laser $T_{3n+1}$ is turned on. Thereafter, the thyristors are operated at the similar timings.

Another type of the beam deflector for controlling a refractive index by an electrical field is employed to constitute a composite thyristor. As is well known, the beam deflector using such an effect can be realized by using a dielectric crystal prism having an electro-optical effect. In case of a semiconductor, not only the electro-optical effect but also Franz-Keldysh effect or a quantum trapping Stark effect using a quantum well can be utilized by applying a reverse bias to a junction. If such a composite effect is applied to a semiconductor waveguide, a semiconductor beam deflector can be easily analogized from the above dielectric thyristor.

Figure 36:
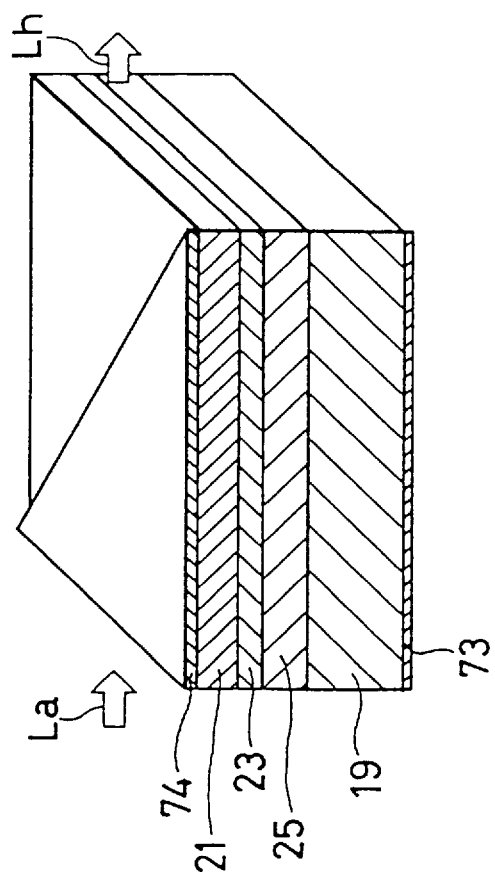
FIG. 36 is a perspective view showing a structure of another beam deflector.

In FIG. 36 showing its structure, an n-type AlGaAs layer 25, an i-type GaAs layer 23, and a p-type AlGaAs layer 21 are formed on an n-type GaAs substrate 19, and anodes 73 and 74 are formed on two major surfaces of the resultant structure. A negative voltage is applied to the anode 74 relative to the anode 73, the i-type GaAs layer 23 is depleted, and an electric field is applied thereto. Depending on this electric field intensity, the refractive index of the i-type Gals layer 23 is changed. Therefore, the refractive index under the anode 74 is different from that of other regions, and this difference can be externally controlled. Thus, the direction of an output beam Lh can be controlled.

Figure 35A:
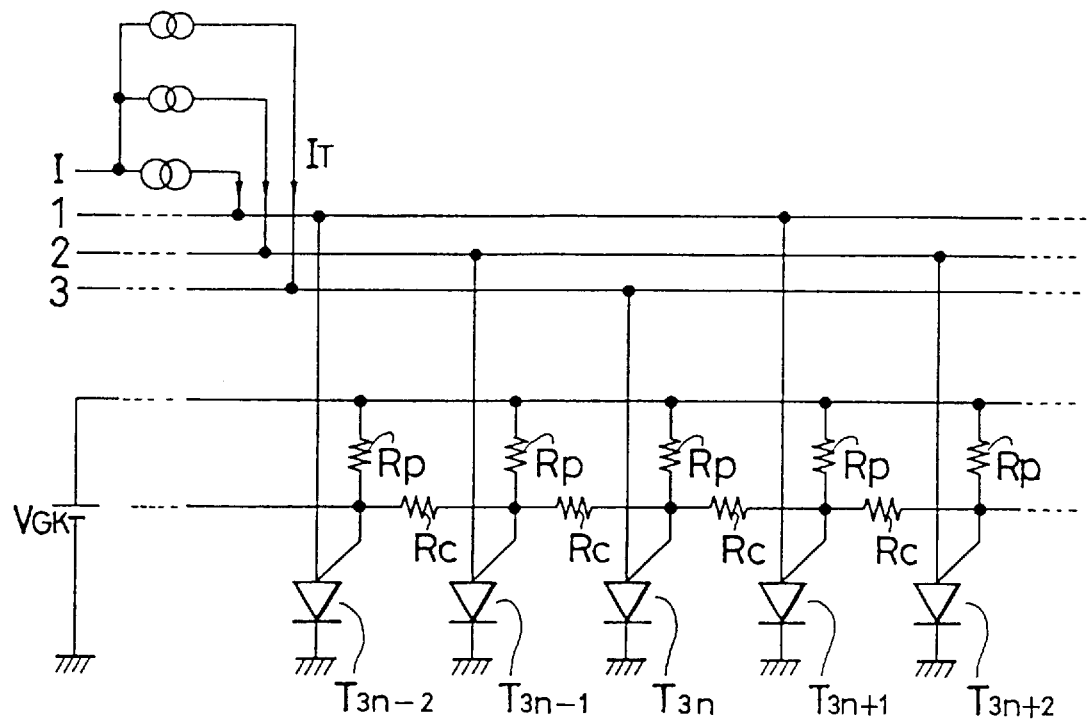
FIGS. 35a and 35b are circuit diagrams of another composite array.
Figure 35B:
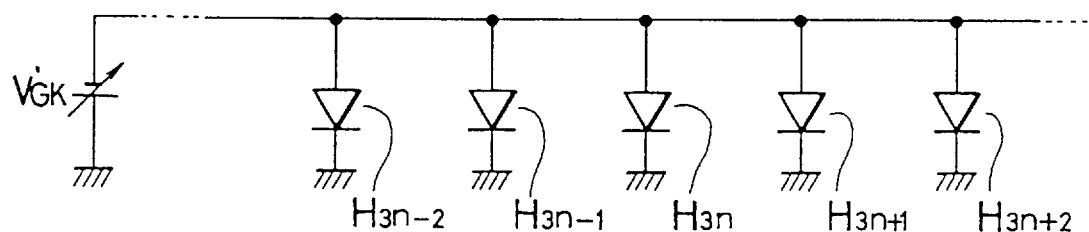

The beam deflector H and the laser thyristor T are combined to realize a composite thyristor as shown in FIGS. 35a and 35b. However, since the beam deflector is used in a reverse bias state, power dissipation is small, and no problem is posed even if all the thyristors are always operated. In this case, the transfer line need only be formed for the laser thyristor T, as shown in FIG. 35b, and no gates are required for the beam deflector H. Only a line for supplying a common ramp voltage $V'_{GK}$ is formed. Of course, the start and ends of this ramp voltage must be caused to coincide with turn-on and turn-off timings of each laser.

Note that the beam deflector H in FIG. 36 may employ another structure. For example, a light waveguide layer may comprise a quantum well layer. In this case, a quantum well laser thyristor is preferably employed to facilitate a manufacturing process.

The anode shape is not limited to that shown in FIG. 36 as long as it can effectively form asymmetrical refractive index distribution. Furthermore, constituting materials need only be those having the above-mentioned effect, and at least materials described in the H-1 can be utilized.

When beam deflectors are added to laser thyristors, resolution of scanning light spots can be improved as compared to a composite thyristor including only a light-emitting array without increasing the number of laser thyristors. Since the threshold current or voltage of the laser thyristors can be controlled and their gates are connected through electrical means, a simple scan system can be established only by applying drive clock pulses. Drive circuits are not complicated for an arrangement including the beam deflectors.

Conventionally, an application to an optical printer using a module in which a drive IC is connected to each pixel of an LED, array is known.

As to the beam deflector, arbitrary thyristors such as one causing a gradient of a refractive index upon injection of a current, one for applying an electric field to control a refractive index and the like, may be used as long as they can deflect incident light.

When the light-emitting array comprises laser thyristors, a light-emitting array having a large amount of light can be obtained due to its high quantization efficiency, thus saving power dissipation or allowing high-speed write access, i.e., printing.

When the composite thyristor is applied to an optical scanning apparatus used in, e.g., an optical printer, optical scanning with, high resolution can be realized. Thus, the present invention can be applied to the optical printer.

The light-emitting array for the optical printer has a linear arrangement. If the arrays are two dimensionally arranged, a display can be prepared. This structure is shown in FIG. 20. If N light-emitting arrays are arranged, an image signal can be written from $\phi_{I3n+1}$ to $\phi_{IN}$. If an integrated light-emitting array is used, a high-density display thyristor can be produced. If independent laser thyristors are combined, a large-area display can be produced.

What is claimed is:

1. A monolithic light-emitting array comprises:
   an array of light-emitting elements having a common substrate and each having a gate and an anode, said light-emitting elements being made of compound semiconductor and including ON state transferring functions;
   coupling means for electrically coupling the gate of one of said light-emitting elements to the gate of the next light emitting elements so that the conducting light-emitting element will cause the next light-emitting element to turn on upon applying energy through its anode;
   at least two transfer lines each connected to anodes of every at least two light-emitting elements; and
   polyphase clock means connected to said transfer lines to provide for transferring a conducting state from one light-emitting element to the next.

2. An array according to claim 1, wherein said clock means develops clock pulses having a leading period and a trailing period, and wherein the trailing period of a clock pulse on a given transfer line overlaps a leading period of the next clock pulse on the next transfer line.

3. An array according to claim 1, wherein pulse width of clock pulses is changed between minimal value corresponding to zero value in n bit digital signal and predetermined value in response to non-zero data in said n bit digital signal where n is a positive integer.

4. A monolithic light-emitting array comprises:
   an array of light-emitting elements each having a gate and an anode and including an ON state transferring function;

coupling means for electrically coupling the gate of one of said light emitting elements to the gate of the next light emitting elements so that the minimal conducting light emitting element will cause the next light-emitting element to minimally turn on upon applying energy through its anode;

at least two transfer lines each connected to anodes of every at least two light-emitting elements;

polyphase clock means ORed to said transfer lines to provide for transferring a minimal conducting state from one light-emitting element to the next; and a current source having outputs each ORed to said transfer line to provide an additional current to said minimal conducting light-emitting element.

5. An array according to claim 4, wherein said light-emitting elements are arranged in one of linear and two-dimensional constitution.

6. An array according to claim 4, wherein said clock means develop clock pulses having a leading period and a trailing period, and wherein the trailing period of a clock pulse on a given transfer line overlaps a leading period of the next clock pulse on the next transfer line.

7. An array according to claim 4, wherein said two-phase clock means is ORed to every other said light-emitting elements through said two transfer lines, and said coupling means being unidirectional means.

8. An array according to claim 4, wherein said three outputs of said clock means are ORed to every three said light-emitting elements through said three transfer lines.

9. An array according to claim 4, further comprising means for shielding light between adjacent light-emitting elements.

10. An array according to claim 4, wherein said coupling means comprises diodes.

11. An array according to claim 4, wherein said coupling means comprises transistors.

12. An array according to claim 4, wherein said light-emitting element has a cell consisting of main and subsidiary light-emitting elements each having an anode and an upper gate, said anode and upper gate of said main light-emitting elements in one cell being connected to those of said subsidiary light-emitting elements in the next cell.

13. An array according to claim 4, wherein said current source comprises luminance control means supplying an analogous current in response to an image signal to cause said minimal conducting light-emitting element to increase its light intensity.

14. An array according to claim 13, wherein a pulse width of said analogous current is wider than that of a clock pulse from said clock means.

15. An array according to claim 4, wherein first said light-emitting element is disposed at a leading end portion of said array and turned on in response to a one-shot pulse at the beginning of self-scanning.

16. An array according to claim 4 wherein said light-emitting element is a laser thyristor having laser beam output emitted perpendicular to the longitudinal direction, and further comprising:

an array of beam deflectors each arranged in front of said laser thyristor to deflect said laser beam output;

means for coupling one gate of said beam deflectors to the next gate thereof so that the minimal conducting state beam deflector cause the next beam deflector to minimally turn on upon applying energy through its anode;

at least two transfer lines each connected to every at least two beam deflectors;

polyphase clock means ORed to said transfer lines to provide a minimal conducting state transferring from said beam deflector to the next; and a controllable current source having outputs each ORed to said transfer line to provide the controllable current to said minimal conducting state beam deflectors.

17. An array according to claim 16, wherein said beam deflector has first and second anodes arranged at two sides of the laser beam output path, currents having symmetrical magnitude being injected to said first and second anodes of said minimal conducting state beam deflector to form a gradient refractive index distribution in a widthwise direction of the laser beam output path.

18. An array according to claim 17, wherein waveforms of the currents applied to said anodes of said beam deflector are ramp-shaped waveforms having opposite gradient directions, so that output light from the laser thyristor is deflected to the left and right about the center of the output path.

19. An array according to claim 18, wherein said anode of said beam deflector has a thyristor structure, each of two thyristor arrays constituted by the elements comprises a structure equivalent to said coupling means and said clock means provided to said light-emitting array to shift a minimal conducting state in the longitudinal direction, and said clock means of said beam deflector supplies clock pulses synchronous with the clock pulses from said clock means of said laser thyristors to said thyristor arrays and supplies the ramp waveform currents superposed on the clock pulses to said thyristor arrays.

20. An array according to claim 16, wherein said beam deflector comprises a dielectric crystal prism for controlling a refractive index with an electric field.

21. An array according to claim 20, wherein a ramp voltage synchronous with a turn-on shift of said light-emitting array is supplied to said dielectric crystal prism.

22. A self-scanning light-emitting array according to claim 4 in which said coupling means comprises a resistor network for coupling gates for controlling threshold levels of said light-emitting elements in a longitudinal direction.

23. An array according to claim 16, further comprising pull-up resistors for coupling said gates to a voltage line.

24. An array according to claim 16, wherein said resistor network comprises one resistor layer bonded to said gates and a conductor of said constant voltage line and extends in the longitudinal direction.

25. An array according to claim 24, wherein said resistor layer comprises a p-type or n-type semiconductor layer.

26. An array according to claim 4, wherein said light-emitting elements includes a gate layer integral to said coupling resistors having a plurality of notches to optimize the resistance of said coupling resistors.

27. An array according to claim 26, wherein said gate layer extends in the longitudinal direction, and its internal resistance is used as said coupling resistors.

28. An array according to claim 27, wherein a width of said gate layer perpendicular to the longitudinal direction is decreased to adjust a resistance of said resistor network.

29. A self-scanning light-emitting array according to claim 4 in which said coupling means includes a transistor having its base connected to a lower gate of said light-emitting element, and its collector connected to an upper gate of the next said light-emitting element.

30. An array according to claim 29, further comprising a pull-up resistor between the collector of said transistor and a bias line.

31. An array according to claim 4, wherein said light-emitting element comprises a cell consisting of a light-emitting thyristor having upper and lower gates and connected to said transfer line, and a transistor having a base integral to said lower gate so that the output of said transistor in said cell is coupled to said upper gate in the next light-emitting thyristor.

32. An array according to claim 22 or 29, wherein a gate metallization extends to a groove between adjacent light-emitting elements to shield the light coupling therebetween.

33. An array according to claim 22 or 29, wherein said light-emitting element comprises a light-emitting thyristor.

34. An array according to claim 22 or 29, wherein said light-emitting element comprises a laser thyristor.

\* \* \* \* \*